(12) United States Patent
Satpathy et al.

(10) Patent No.: US 10,694,217 B2
(45) Date of Patent: Jun. 23, 2020

(54) EFFICIENT LENGTH LIMITING OF COMPRESSION CODES

(71) Applicant: Intel Corporation, Santa Clara, CA (US)

(72) Inventors: Sudhir K. Satpathy, Hillsboro, OR (US); Vinodh Gopal, Westborough, MA (US); James D. Guilford, Northborough, MA (US); Sanu K. Mathew, Portland, OR (US); Vikram B. Suresh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/137,985

(22) Filed: Sep. 21, 2018

(65) Prior Publication Data
US 2020/0099958 A1  Mar. 26, 2020

(51) Int. Cl.
| | | |
|---|---|---|
| *H04N 19/96* | (2014.01) | |
| *H03M 7/40* | (2006.01) | |
| *H04N 19/13* | (2014.01) | |

(52) U.S. Cl.
CPC .......... *H04N 19/96* (2014.11); *H03M 7/4093* (2013.01); *H04N 19/13* (2014.11)

(58) Field of Classification Search
CPC ...... H04N 19/96; H04N 19/13; H03M 7/4093
See application file for complete search history.

(56) References Cited

U.S. PATENT DOCUMENTS

| | | | | |
|---|---|---|---|---|
| 5,546,080 A | * | 8/1996 | Langdon, Jr. | G06T 9/005 341/107 |
| 5,966,709 A | * | 10/1999 | Zhang | H03M 7/3084 |
| 2009/0058693 A1 | * | 3/2009 | Laker | H03M 7/3086 341/65 |
| 2013/0099947 A1 | * | 4/2013 | Dickie | H03M 7/4037 341/59 |
| 2015/0109153 A1 | * | 4/2015 | Wu | H03M 7/30 341/65 |
| 2015/0358219 A1 | * | 12/2015 | Kanda | H04L 41/0896 709/224 |
| 2017/0187388 A1 | * | 6/2017 | Satpathy | H03M 7/3082 |

* cited by examiner

*Primary Examiner* — Marnie A Matt
(74) *Attorney, Agent, or Firm* — Lowenstein Sandler LLP

(57) ABSTRACT

A processing device includes compression circuitry to encode an input stream with an encoding that translates multiple symbols of fixed length into multiple codes of variable length between one and a maximum length, to generate a compressed stream. The compression circuitry is to: determine at least a first symbol of the multiple symbols having a first code that exceeds the maximum length; identify a short code of the multiple codes that is to be lengthened to provide an increased encoding capacity for the at least the first symbol; generate multiple code-length converted values including to increase the length of the short code to the maximum length and decrease, to the maximum length, a length of the first code of the at least the first symbol; and generate, with use of the set of code-length converted values, the compressed stream at the output terminal.

22 Claims, 17 Drawing Sheets

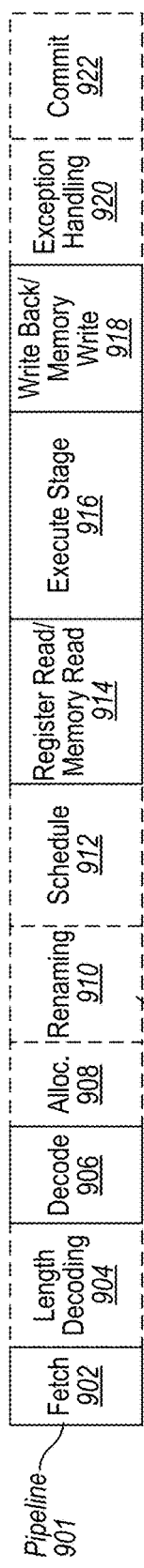
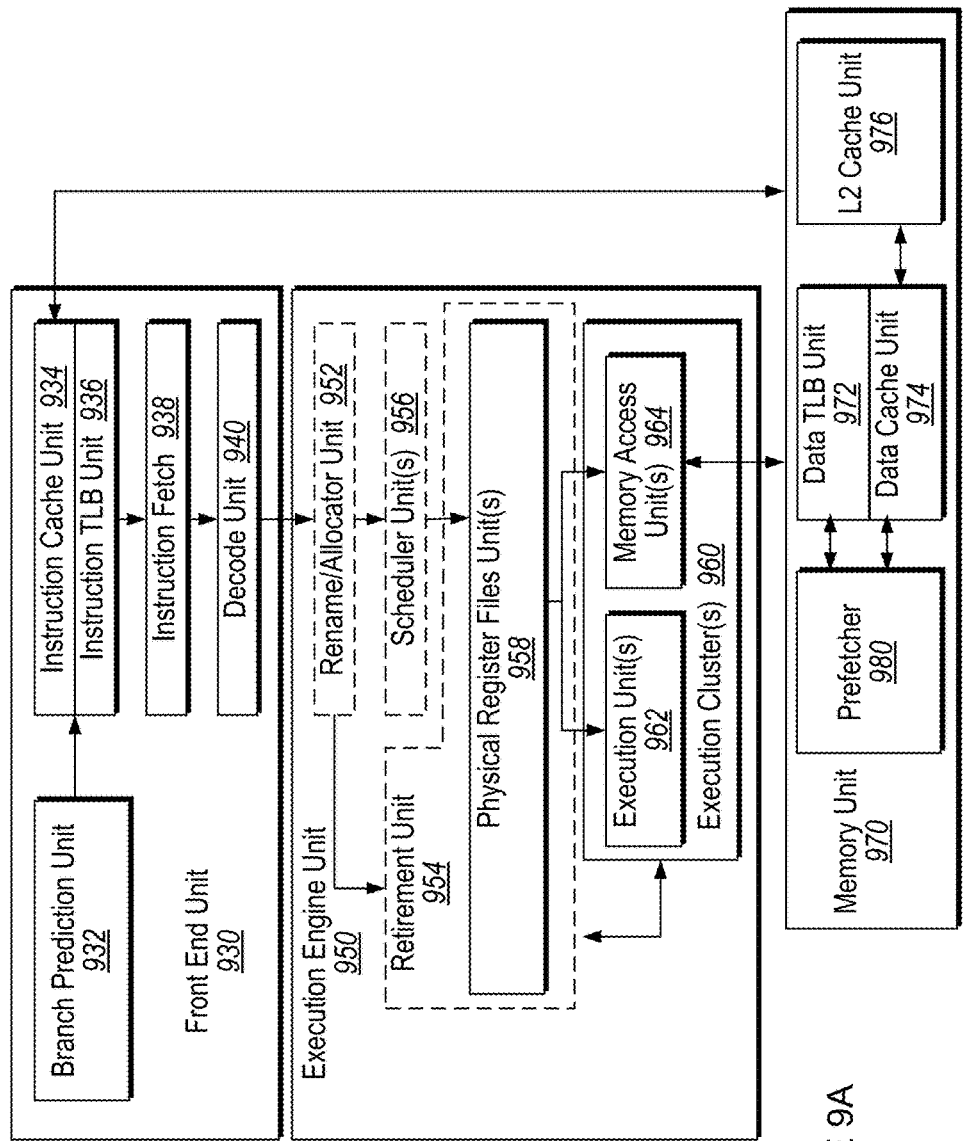
FIGURE 9B
FIGURE 9A

EFFICIENT LENGTH LIMITING OF COMPRESSION CODES

TECHNICAL FIELD

Embodiments of the disclosure relate generally to data compression, and more specifically, but without limitation, to efficient length limiting of compression codes.

BACKGROUND

Content processing pipelines use lossless data compression for storage reduction and bandwidth enhancement. The most widely used compression standard, Deflate, is based on Huffman encoding that translates fixed-length symbols into variable length codes that span between one bit and 15 bits in accordance with relative frequency of occurrence of the fixed-length symbols in a processed data stream. A conventional canonical Huffman encoding (CHE) algorithm does not guarantee any maximum bound for code length. Hence, under scenarios where any code length exceeds 15 bits, the entire CHE process is repeated with frequency adjustment for length-limitation, incurring thousands of cycles of latency and diminishing overall compression throughput. Furthermore, emerging compression standards in the industry cause significant increase in the number of symbols that undergo CHE, which in turn causes more frequent code length limitations, compounding the performance penalties incurred due to length limitations.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 9A is a block diagram illustrating a micro-architecture for a processor according to an embodiment of the disclosure.

FIG. 9B is a block diagram illustrating an in-order pipeline and a register renaming stage, out-of-order issue/execution pipeline according to an embodiment of the disclosure.

DETAILED DESCRIPTION

Figure 1:
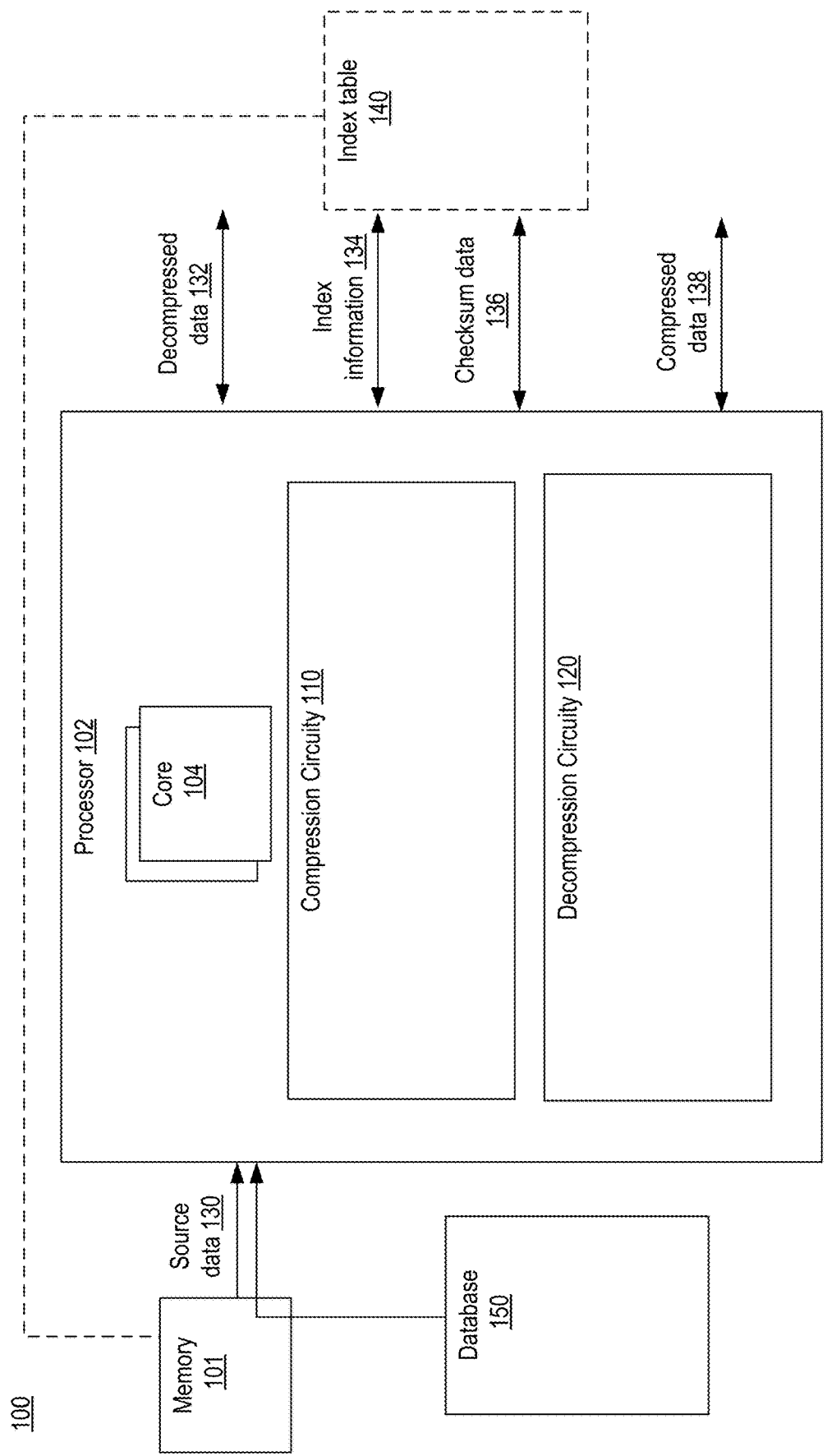
FIG. 1 is a block diagram of a processing device adapted to perform compression and decompression according to various embodiments.

The embodiments described herein are directed to data compression techniques focused on significantly increasing efficiency of length limiting compression codes. For example, the length limiting of compression codes such as Huffman codes generated using canonical Huffman encoding (CHE) may be performed without conventional frequency adjustments to uniformly reduce weights of symbols and subsequent regeneration of encoding trees after such adjustments. Foregoing such conventional frequency adjustments will save thousands of cycles of latency and avoid diminishment of overall compression throughput seen in conventional length limiting techniques.

Emerging standards like Xpress (of Microsoft® Corporation) and Brotli (of Google®) use identical CHE constraints as Deflate where the maximum permissible code length is fifteen ("15"). Note that Xpress and Brotli are merely two recently emerging standards, and others are anticipated that aim to increase compression rates within larger amounts of data. For example, a significantly higher number of symbols undergo CHE, up to 512 in Xpress and up to 704 in Brotli as opposed to 286 in Deflate, necessitating more frequent code length limitation. Furthermore, a Brotli header can pack a maximum of 256 Huffman trees (each tree with 704 symbols), rendering conventional approaches that rely on rebuilding the entire encoding tree extremely slow. As a technical solution, disclosed are alternative techniques for length limiting compression codes that do not require reconstructing the entire encoding tree. This not only improves compression throughput, but also enables a more-efficient accelerator implementation by eliminating the need to store symbol frequencies (or weights) for subsequent length-limitation. In addition, the disclosed techniques may be implemented in software, firmware, and programmable platforms like field-programmable gate array (FPGA) devices to improve existing compression accelerators.

More specifically, in one embodiment, a processing device may include an input terminal to receive an input stream of source data and an output terminal to output a compressed stream of the source data. The processing device may also include compression circuitry coupled to the input terminal and to the output terminal. The compression circuitry may encode the input stream with an encoding that translates multiple symbols of fixed length into multiple codes of variable length between one and a maximum length. In disclosed embodiments, the compression circuitry may determine at least a first symbol of the multiple symbols having a first code that exceeds the maximum length, although in practice there may be a number of symbols that exceed the maximum length as just discussed. The compression circuitry may further identify a short code of the multiple codes that is to be lengthened to provide an increased encoding capacity for the at least the first symbol, the short code having a length less than the maximum length. The compression circuitry may further generate multiple code-length converted values including to increase the length of the short code to the maximum length and decrease, to the maximum length, a length of the first code of the at least the first symbol. The compression circuitry may further generate, with use of the multiple code-length converted values, the compressed stream at the output terminal.

FIG. 1 is a block diagram of a processing device 100 (or system) adapted to perform compression and decompression according to various embodiments. Processing device 100 may include, among other things, memory 101 and a processor 102. The processor 102 may further include, without limitation, a core 104 (or multiple cores), compression circuitry 110, and decompression circuitry 120 that are coupled to one another. In various embodiments, the compression circuitry 110 may include or may be disposed within or be instantiated as a processor circuit, a system on a chip (SoC), a field-programmable gate array (FPGA), or the like.

Figure 3A:
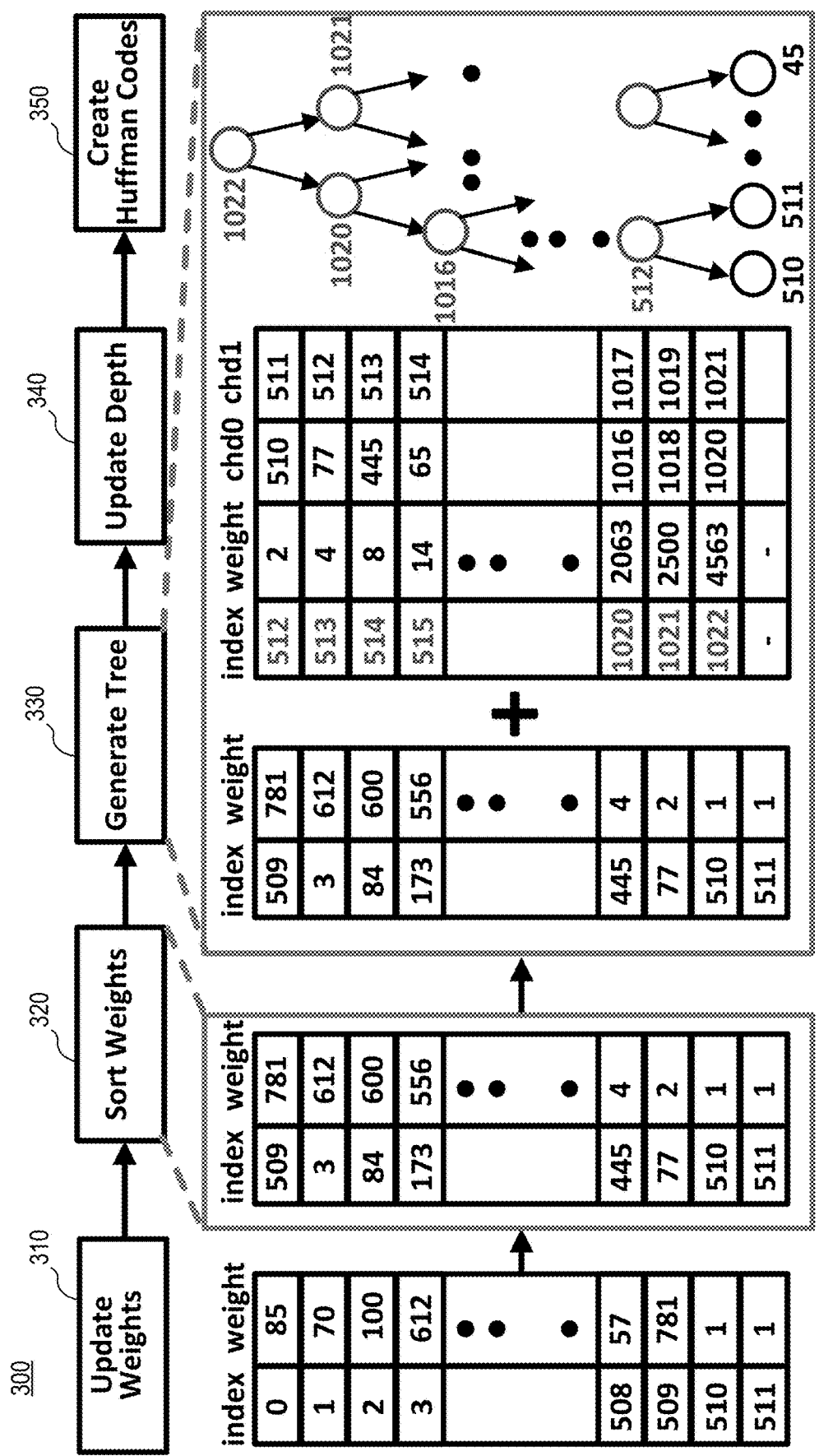
FIG. 3A is a flow diagram illustrating explanatory tables of first steps of performing a canonical Huffman encoding (CHE) algorithm according to an embodiment.
Figure 3B:
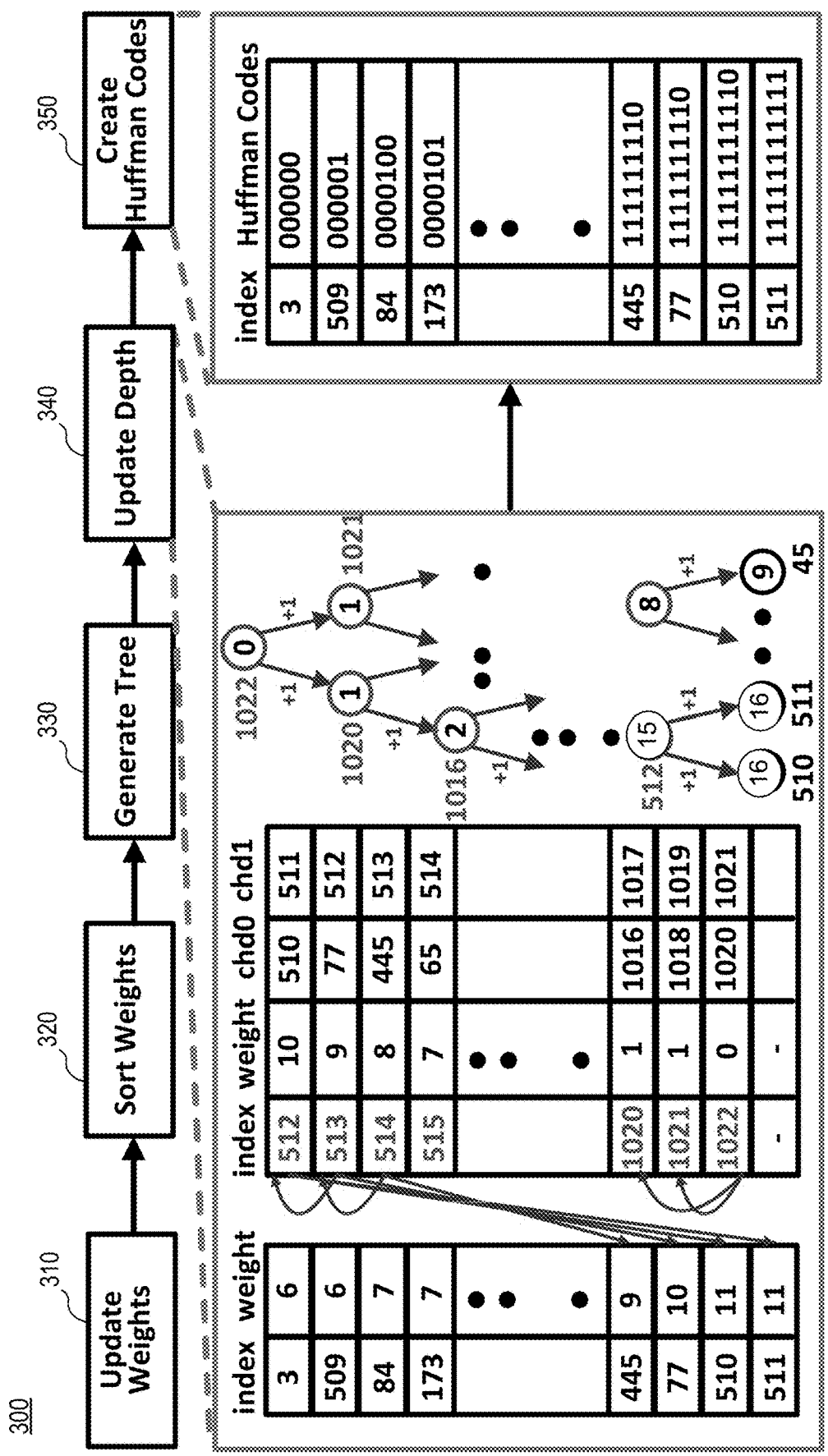
FIG. 3B is a flow diagram illustrating explanatory tables of final steps of performing the CHE algorithm according to an embodiment.

In some embodiments, compression circuitry 110 may be implemented in software, firmware, hardware, or a combination thereof. In various embodiments, compression circuitry 110 may be implemented in hardware configured to execute software, firmware, and/or the like to perform operations according to some embodiments. In some embodiments, compression circuitry 110 may be or may include a compression software application operative to compress data to generate compressed data. Additionally or alternatively, compression circuitry 110 may be or may include a compression software application executed by the processor 102. Compression circuitry 110 may include a data input/output interface (not shown) configured to access source data 130. Compression circuitry 110 may then compress the source data to generate compressed data 138 (e.g., blocks and sub-blocks). An example of the compression process is illustrated in FIGS. 3A-3B as will be described in further detail below.

In various embodiments, the compressed data 138 may include compressed data formed of discrete blocks (e.g., a Deflate block or Deflate-based block). The blocks of compressed data may be formed of various block elements, including, without limitation, headers and sub-blocks. In some embodiments, source data 130 may include uncompressed data. In various embodiments, source data 130 may include compressed data generated using conventional compression techniques (for instance, compressed data that does not include discrete sub-blocks or mini-blocks). Accordingly, in some embodiments, compression circuitry 110 (for instance, in combination with the decompression circuitry 120) may operate to transform conventional compressed data into the compressed data 138 (that includes blocks and sub-blocks). The source data 130 may be embodied within an input stream of data in various embodiments.

The compression circuitry 110 may receive the source data 130 from various sources, including software applications or threads, hardware elements, data buffers, and/or the like. For instance, the source data 130 may be obtained from a database 150 or other data source stored temporarily in the memory 101. In various embodiments, the database 150 may include data from a big data platform, such as a data center, cloud computing environment, distributed computing environment, social networking platform, business analytics platform, and/or the like. In general, a big data platform may be defined by various characteristics of the data associated with the platform, such as the volume, velocity, variety, and/or value of the data. In some embodiments, the database 150 may include a column-oriented (or columnar) database, for instance, of a database management system (DBMS). In general, a column-oriented database stores data by columns instead of by row. In a column-oriented database, each column may be stored separately, with attribute values of the same column stored contiguously. Although column-oriented databases are used in some examples, embodiments are not so limited as other types of databases may be used as database 150 or as source data 130 according to some embodiments. Non-limiting types of other databases may include relational databases, correlation databases, object databases, hierarchical databases, and/or the like.

In addition, the database 150 and source data 130 may include databases or data sources from various proprietary and/or open source platforms, such as Oracle®, Microsoft® SQL Server, IBM® Informix®, SAP® Sybase®, and/or the like. In various embodiments, the source data 130 may be in the form of a data sequence or stream received by or otherwise accessed by compression circuitry 110. A data buffer (not shown) may be used to store data, such as intermediate data, data waiting to be compressed, compressed data waiting to be transmitted, and/or the like. In some embodiments, the compression circuitry 110 may access compressed data stored within the data buffer for transmission to a consumer of the compressed data.

The compression circuitry 110 may be operative to compress the source data 130 to generate the compressed data 138. In various embodiments, the compression circuitry 110 accesses or generates a checksum (e.g., cyclic redundancy check (CRC)) of the source data 130. The checksum of the uncompressed source data 130 may then be compared with a calculated checksum (e.g., CRC) of the uncompressed data that is output from the decompressor (or compare the checksum of the uncompressed data that is output from the decompressor against a stored checksum of the uncompressed data) to verify, among other things, that the compressed data is not corrupted. Additionally, the compression circuitry 110 may compress the source data based on compression configuration.

In various embodiments, the compression circuitry 110 may include a compression engine, algorithm, process, software application, firmware application, processor, co-processor, FPGA, and/or the like. The compression circuitry 110 may be configured to encode or compress data using a discrete compression process according to some embodiments. The discrete compression process may be based on one or more existing compression processes. Non-limiting examples of compression processes may include lossless data compression, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like.

In some embodiments, the discrete compression process performed by compression circuitry 110 may include a variation of LZ77 compression and/or Deflate. For example, the discrete compression process may operate using a Deflate compression process except that, among other things, instead of generating compressed data formed of conventional Deflate blocks, the discrete compression process may generate discrete compressed data that includes discrete sub-blocks according to some embodiments. In various embodiments, the discrete compressed data may include Deflate blocks formed of one or more discrete sub-blocks. In general, a conventional Deflate compression process may keep track of history information in each Deflate block. Accordingly, at any point in the Deflate-compressed data, such as for a particular Deflate block, there is history information of the preceding characters for a certain window (which may include data in one or more other Deflate blocks), such as 32 KB window.

In one embodiment, a 32 KB sliding window means that the compressor (and decompressor) have a record of what the last 32768 (32*1024) characters were. Accordingly, decompressing data of an operation target stored in a Deflate block may require decompressing at least an entire Deflate block as well as any blocks referred to in the historical information of the Deflate block (which may also include historical information referring to still other Deflate blocks, and so on). However, in some embodiments, the discrete compression process may use a LZ77-based and/or Deflate-based compression process, but may generate compressed data formed of, among other things, discrete blocks according to some embodiments instead of conventional Deflate blocks. For instance, in some embodiments, the discrete sub-blocks may not include historical information that references other discrete sub-blocks (the historical information may point to other data within the same discrete sub-block). In some embodiments, each discrete sub-block may include all of the information necessary to decompress the discrete sub-block and may not rely on other discrete sub-blocks in order to be decompressed. Although LZ77 and Deflate are used as examples, embodiments are not so limited as other compression processes capable of being used according to some embodiments are contemplated herein.

In general, the LZ77 compression process operates by replacing repeated occurrences of data with references to previous occurrences of that data existing earlier in the input (uncompressed) data stream. A match is encoded by a pair of numbers called a length-distance pair ("distance" may be referred to as an "offset"). As such, the LZ77 compression process finds repeated substrings and replaces them with backward references (relative distance offsets). The LZ77 compression process can use a reference to a duplicated string if the relative distance is less than the maximal history size defined in the algorithm encoding (for instance, 32 KB in Deflate). The compressed data consists of a series of elements of two types: literal bytes (copy of the data) and pointers to replicated strings, where a pointer is represented as the pair <length, backward distance>. The various algorithms in the LZ77 family all find LZ77 string matches during compression, but encode the literals or references differently (for instance, Huffman codes in Deflate, simple byte-oriented packing in Snappy, and/or the like), and have different maximal history windows. In general, a literal may include raw encoded data (as opposed to data encoded as a length, distance pair).

To spot matches, the LZ77 encoder keeps track of some amount of the most recent data, such as the last 2 kB, 4 kB, 32 kB, and/or the like. The structure in which this data is held is called a "sliding window" or "history window" (accordingly, LZ77 is sometimes referred to as sliding window compression). The encoder keeps the most recent data within the sliding window to look for matches (and the decoder likewise will keep this data to interpret the matches the encoder refers to). Accordingly, at any point in the data, such as for a particular Deflate block, there is a record ("history" or "history information") of the preceding characters (which may be in one or more other Deflate blocks). A 32 KB sliding window means that the compressor (and decompressor) have a record of what the last 32768 (32*1024) characters were. Note that when "encoder" is referred to herein, reference is understood to be made to the compression circuitry 110 that performs the encoding involved with compression (see FIG. 2). Likewise, when "decoder" is referred to herein, reference is understood to be made to the decompression circuitry 120 that perform the decoding involved with decompression. During LZ77 compression, byte patterns of a preceding (earlier or older) portion of a byte stream may be compared against a current portion (or current bit sequence) of the byte stream. If a sequence of bytes is found in the current portion that matches a sequence of bytes in the preceding portion (or preceding byte sequence), the sequence of bytes in the current portion is replaced with a reference to the same sequence of bytes in the earlier portion.

The reference that is inserted for the current byte sequence identifies the length of the current byte sequence and the location of the preceding byte sequence expressed, for instance, as a "distance" from the current byte sequence to the matching preceding byte sequence. As such, the LZ77 compression process encodes a byte sequence as a "length, distance pair" that is inserted in the byte stream in place of a current byte sequence. Upon decoding the compressed stream, when the decoder reaches the length, distance pair that is embedded in the byte stream, the decoder uses the distance part of the length, distance pair to refer back to the start of the matching byte sequence and reproduces the correct byte sequence of the decoded stream by reproducing a number of bytes from the start of the matching byte sequence that is equal to the length component of the length, distance pair.

A non-limiting example of an LZ77 compression process may be performed on the following illustrative sequence, recited in a form prior to compression: "ABCD BBBB BC CDE DEFG BBBB EFGH." During compression, the LZ77 compression process may locate the match "BBBB," having a length of 6 (including spaces). The matching "BBBB" sequences have a match offset (for instance, an intervening distance) of 15. The compressed sentence may be in the following form: "ABCD BBBB BC CDE DEFG @(6,15) EFGH," with "(6,15)" being the length and distance pair associated with the BBBB match.

The Deflate compression process is used as the bases of various compression platforms, such as gzip/Zlib and Winzip/PKzip. In general, Deflate uses a series of blocks (Deflate blocks) corresponding to successive blocks of input data. Each block may be compressed using a combination of the LZ77 compression process and Huffman coding. As described above, the LZ77 compression process operates to find repeated substrings and replaces the repeated substrings with references, such as relative distance offsets. The LZ77 compression process may use a reference to a duplicated string occurring in the same block or previous blocks, for instance, up to 32 KB previous input bytes (a "history" or "history information"). The compressed data may include a series of elements of two types: literal bytes and pointers to replicate strings (represented as the pair: <length, backward distance>). The LZ77 compression process operates to find string matches at each position.

Using data structures to efficiently index locations where matching strings may be found, the LZ77 compression process may operate to search a number of locations to determine a "best" match. The effort (for instance, the number of searches attempted) is specified by the compression level. For instance, gzip/Zlib defines a number of compression levels, ranging from 1 to 9, with 9 being the highest compression level and requiring the highest processing cost. A file may be represented as a series of symbols (also referred to as tokens), where each symbol may represent a literal byte or a match of text that occurred previously. The symbols may be encoded using a variable-size code (for instance, a Huffman code followed by certain "extra bits").

With further reference to FIG. 1, the decompression circuitry 120 is operable to decompress compressed data, such as the compressed data 138 to generate the decompressed data 132. In some embodiments, the decompression circuitry 120 may operate to generate index information 134 during the decompress-verify process (subsequent to or concurrently with the compression process). In some embodiments, the index information 134 may include information for decompression circuitry to access data within compressed data 138, such as data at a particular block (for instance, a Deflate block) and/or discrete sub-block of the compressed data 138. For example, the index information 134 may include an index array or other data structure that may record offset information for Deflate blocks and/or sub-blocks of the compressed data 138. In various embodiments, the offset information may include a starting bit offset for each discrete block, a bit offset for a first symbol of each discrete block, a bit offset of headers associated with the discrete blocks, and/or the like. In some embodiments, the decompression circuitry 120 may use index information 134 to decompress the compressed data 138 to generate decompressed data 132.

In some embodiments, the index information 134 is provided to an index table 140. The index table 140, in various embodiments, is generated by decompression circuitry 120. In one embodiment, the decompression circuitry 120 includes the index table 140. Alternatively, the decompression circuitry 120 does not include the index table 140. For example, the index table 140 is stored in the memory 101.

The decompression circuitry 120, in various embodiments, generates checksum data 136 in response to the decompression circuitry 120 generating the index information 134. As will be described in further detail below, the checksum data 136 is a cumulative checksum corresponding to sub-blocks in the compressed data. The checksum data 136 is also provided to the index table 140. Accordingly, the index table 140 may include the index information 134 as well as the checksum data 136 corresponding to particular components of the compressed data 138, e.g., header, block, sub-block, and the like.

The decompression circuitry 120, in various embodiments, determines whether the checksum of the uncompressed source data (accessed/generated by compression circuitry 110) matches the checksum data 136 of the compressed data, and whether compression circuitry 110 generated the mini-blocks appropriately, which will be described in further detail below.

In various embodiments, the compression circuitry 110 includes one output for outputting compressed data 138. As a result, the compression circuitry 110 may be unable to concurrently generate and output the index information 134 and/or checksum data 136. Accordingly, the decompression circuitry 120 is able to (while not outputting decompressed data 132) generate the index information 134 and/or checksum data 136 while the compression circuitry 110 is generating the compressed data 138. Alternatively, in some embodiments, the processing related to the index information is provided by the compression circuitry (during the verify flow). For example, the compression circuitry can buffer a limited number of some sizes of sub-blocks (e.g., 128) and then write out an output stream, or to a configuration space where state is saved.

In various embodiments, the compressed data 138 may include a Deflate (or Deflate-based) compression stream such that the compressed data 138 may be decompressed using a Deflate-compliant compressor. In various embodiments, to perform a random operation on the compressed data 138, such as decompressing the compressed data 132, the decompression circuitry 120 may use the index information 134 to determine which discrete block includes an operation target and where a corresponding header (for instance, Deflate header of a corresponding Deflate block) is located. The header would then be conceptually appended to the discrete sub-block and the discrete sub-block would be decompressed. This is done to gain the effect of decompressing the combined data without needing to actually append the data. In one embodiment, for example, if the decompressor supported appropriate gather functionality, then the header and the sub-block could be specified as entries on the gather list. Accordingly, to decompress a single element according to some embodiments, a discrete decompression process would only have to decompress, on average, half of a discrete block (compared with an entire column of data for compressed column-orientated data).

Figure 2:
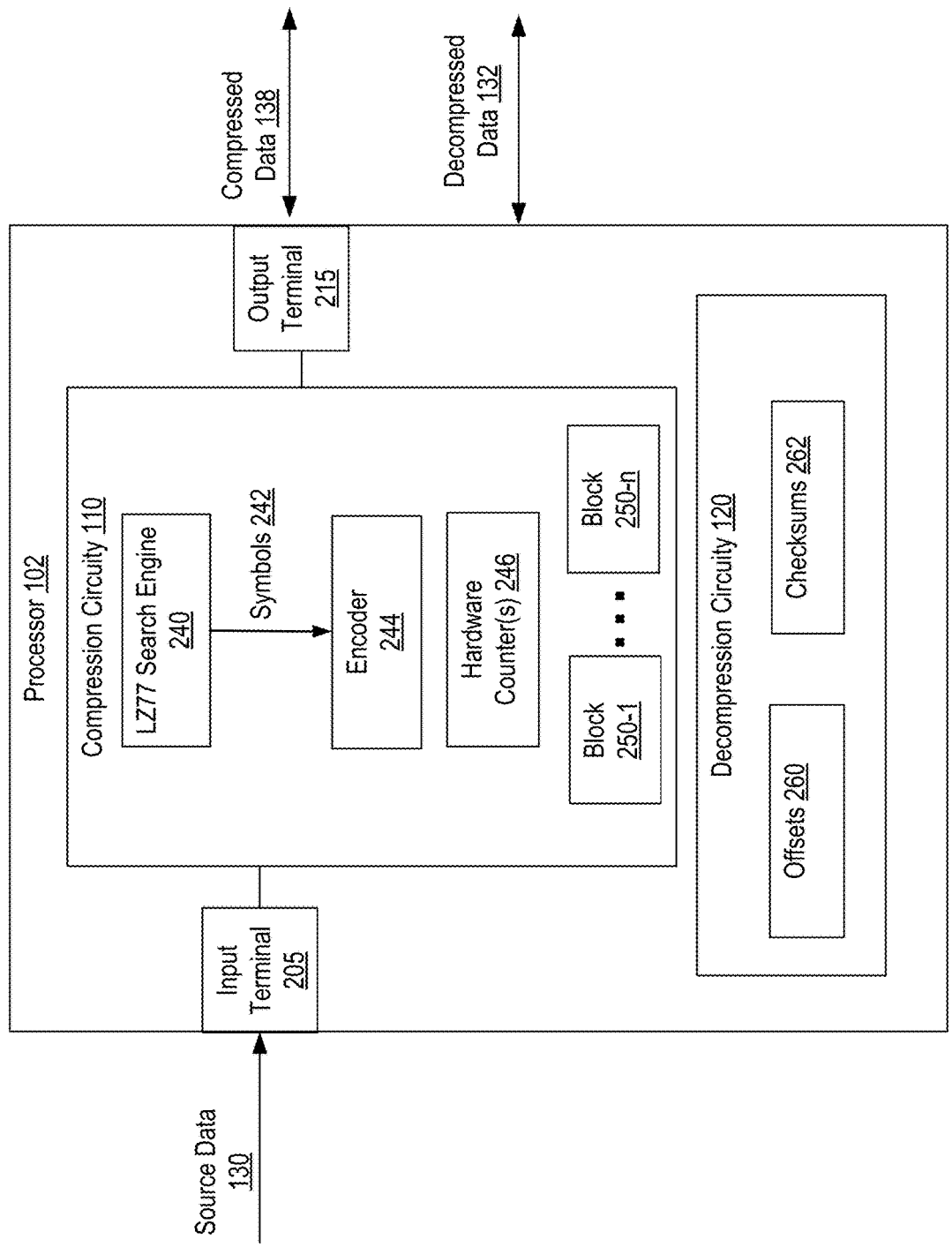
FIG. 2 is a block diagram of a processor including compression circuitry and decompression circuitry according to various embodiments.

FIG. 2 is a block diagram of the processor 102 including the compression circuitry 110 and the decompression circuitry 120 according to various embodiments. The processor 102 may further include an input terminal 205 from which to receive the source data 130 (e.g., in input stream of source data), and an output terminal 215 through which to output the compressed data 138 (e.g., a compressed stream of the source data). The compression circuitry 110 may be operative to generate the compressed data 138. In some embodiments, the compression circuitry 110 may be implemented in hardware and/or software executed via processor circuitry.

In various embodiments, the compression circuitry 110 may be configured to operate a LZ77-based and/or Deflate-based discrete compression process. In general, the compression circuitry 110 may be configured to operate a discrete compression process according to some embodiments to compress data according to a Deflate-based compression process using discrete blocks in place of or in combination with conventional Deflate blocks.

As shown in FIG. 2, a LZ77 search engine 240 of compression circuitry 110 may receive the source data 130. The LZ77 search engine 240 may analyze the source data 130 for repeated patterns. Repeated patterns of a certain length (for instance, greater than or equal to 3 characters) may be reduced to a length-distance pair symbol. The symbols 242 may be provided to an encoder 244, such as a Huffman encoder, of the compression circuitry 110. In various embodiments, the encoder 244 may operate to encode symbols 242, for instance, by encoding most-frequently seen symbols 242 with a minimum size bit symbol. The compression circuitry 110 may further include or have access to a set of hardware counters 246 to track a number of symbols processed during compression as well as the number of those symbols that exceed a maximum length.

In various embodiments, during compression, the encoder 244 may generate blocks 250-1 to 250-*n*. In some embodiments, blocks 250 may be Deflate blocks formed of discrete sub-blocks. In various embodiments, the encoder 244 may generate blocks 250 that include a predetermined number of discrete sub-blocks. For example, encoder 244 may generate a new Deflate block every n sub-blocks, where n may include 1, 2, 3, 4 and so on. Accordingly, in some embodiments, each Deflate block includes a certain number of integral, undivided discrete blocks (for instance, a sub-block may not span multiple Deflate blocks).

A discrete sub-block may be configured to include a certain amount of data. In some embodiments, the predetermined amount of data may include 1 kb, 2 kb, 3 kb, etc. It should be appreciated that the sub-block can include any predetermined amount of data. In some embodiments, each sub-block includes a predetermined amount of data (e.g., each sub-block includes 1 kb of data). In some embodiments, discrete blocks may have different amounts data. In some embodiments, discrete blocks may each have the same (or substantially similar) amount or limit on the amount of data. In various embodiments, each discrete block may include a fixed amount of about 1 KB of uncompressed data. In some embodiments, the amount of data may not be constrained from the Deflate standard and a sub-block may be generated after a first symbol 242 that reaches the next sub-block boundary.

A discrete compression process according to some embodiments may generate various compression configurations based on one or more characteristics, such as block size, sub-block size, number of sub-blocks in each Deflate block, and/or the like. For example, a compression configuration including sub-block of size 1 KB with four discrete sub-blocks per Deflate block may have a compression configuration of ¼. In another example, a compression configuration may include 1/16 with a sub-block size of 1 KB and block size of 16 KB (for instance, 16 discrete blocks per high-level block).

In some embodiments, the compression circuitry 110 truncates a last match so that the length does not cross into the next sub-block, by possibly encoding the last few bytes as literals. As described above, the compression circuitry may provide a predetermined sub-block size (e.g., 1 kb). However, the compression circuitry may generate a sub-block that is slightly larger than the predetermined sub-block size in order to save a last match that may extend beyond the sub-block having a predetermined size. If a sub-block is generated with a size that beyond the predetermined sub-block size, then the index table would include additional information to properly decompress the sub-blocks. For example, in one embodiment, the index table would further include the boundaries of a sub-block in both the compressed data stream and in uncompressed data stream.

In various embodiments, the compression circuitry 110 may use one or more default compression configurations to generate discrete compressed data. In some embodiments, the compression circuitry 110 may use an optimal compression configuration determined to provide one or more optimal compression characteristics (for instance, compression ratio, compression speed, and/or the like) for the data being compressed. In some embodiments, optimal compression configurations for a particular data source (for instance, a column-oriented database) may be stored, such as in memory or as meta data in a database associated with a data source, and may be looked up by compression circuitry 110 for use during a discrete compression process.

The decompression circuitry 120 may be coupled to compression circuitry 110 and be operable to generate the decompressed data 132, offsets 260 and checksums 262, which will be described in further detail below. The decompression circuitry 120, in various embodiments, is provided two flags (not currently in the Deflate scheme) as indicated in Table 1.

TABLE 1

| | | |
|---|---|---|
| Disable_Decompress_Output | 1-bit | Doesn't write decompressed bytes to output stream |
| Index_Size | 3-bit | Defines sub-blocks (512 . . . 32k, etc.), zero disable features |

If the bits (with respect to Table 1) are both 0, then decompression occurs as a normal operation generating the uncompressed stream. If disable_decompress_output is set, and index-size is zero ("0"), then decompression occurs as a normal operation. The checksum (e.g., CRC) is calculated but no decompressed output is written to the output stream. This is to aid some decompress-verify flows on checksum data.

If index_size is non-zero, then disable_decompress_output is to be set. The following concerns the case where index_size is non-zero (i.e. where a sub-block scheme has been used while compressing). The index_size defines the sub-block size. The sub-block size is a power of 2 (>=512). In this mode, the expectation is that the act of decompressing is to verify the compressed bit-stream in entirety, as well as the formation of mini-blocks, via CRCs (and not really output the uncompressed data). The uncompressed data is written out from output accumulators in the decompression circuitry but suppressed from the write-port. The write-port is reserved instead for writing out the stream of bit-index and CRC meta-data per sub-block.

The decompression circuitry 120 may check for the following to ensure valid construction of blocks/sub-blocks by the compression circuitry 110:
1. If a Deflate Block header is seen, and the cumulative number of output bytes is not a multiple of the mini-block size, then decompression circuitry returns an error. The exception to this are zero-length stored blocks.
2. If the output of a match symbol (reference, length-distance) straddles two mini-blocks, the decompression circuitry returns an error.
3. If a stored block is seen, and the size is not a multiple of the mini-block size, the decompression circuitry returns an error. This check can be done just for non-final blocks. This check should be done for blocks other than zero-length stored blocks.
4. If the output overflows, it is a non-recoverable error.
5. The normal distance check error that will be modified when there is a sub-block specified. After every sub-block, it is ensured that the valid-distance drops to 0 and then starts to count up again. Thus, a more stringent distance check is performed for the references when a sub-block has been specified. This guarantees that the overall deflate stream will also be well-formed.

It should be appreciated that above list of checks is non-limiting list. In various embodiments, more or less checks may be performed.

A general write flow is now described according to some embodiments. First, the compression circuitry 110 may be configured with sub block size and sub-block mode. Second, the source data may be compressed and the CRC for the whole uncompressed data is determined. Third, the decompression circuitry 120 may be configured in decompress-verify mode using CRCs but also with sub-block mode enabled. Fourth, the decompression circuitry 120 may not output the uncompressed data but compute the CRC of the whole data stream and periodically output the cumulative CRC (e.g., checksums 262) up to a given point (e.g., offsets 260). For example, given the cumulative CRC at the start of a sub-block and the cumulative CRC at the end of the sub-block (and the size of the sub-block), the decompression circuitry 120 may compute the CRC of the sub-block, but neither cumulative CRC is the CRC of that sub-block (except for the case of the first sub-block, where the initial CRC is 0). Specifically, if the sub-block size was 100 bytes, the CRCs of the following regions are computed: (0 . . . 99), (0 . . . 199), (0 . . . 299), etc. Fifth, the decompression circuitry 120 may verify if every sub-block was correctly generated in the deflate stream and check the whole-file checksum from the decompression circuitry 120 against the one computed by the compression circuitry 110.

A general read flow is now described according to some embodiments. If a whole column/file is needed, the decompression circuitry 120 may set up to read a normal deflate stream as usual. If a random access is needed, and no meta-data is available (e.g., indices and the CRC data), the decompression circuitry 120 may generate sub-block meta-data (the sub-block size used by the compressor has to be known at a minimum, but this can be a parameter for the whole database, or table). For random access with meta-data available (e.g., indices and the CRC data), the starting sub-block position is determined and the decompression circuitry 120 may be loaded with bit-stream containing the deflate header (e.g., parsing the Huffman tables and saving state). Then, a second job is submitted with the actual start of sub-block symbols after restoring the saved state.

FIG. 3A is a flow diagram illustrating explanatory tables of first steps of performing a canonical Huffman encoding (CHE) algorithm 300 according to an embodiment. FIG. 3B is a flow diagram illustrating explanatory tables of final steps of performing the CHE algorithm according to an embodiment. The reader will note that the weightings of the examples in FIGS. 3A and 3B may vary from figure to figure for purposes of variety of explanation.

In the illustrated embodiments, the CHE algorithm 300 may update weights of symbols located within an input stream of data and as indexed in one of the indexing methods previously discussed (310). In one embodiment, the higher the weight assigned to the symbol the more frequently that symbol occurs, and vice versa, the lower the weight assigned to the symbol the less frequently that symbol occurs. This weighting convention may, of course, be reversed with reverse treatment of higher weights versus lower weights in generating a tree and creating Huffman codes.

In various embodiments, the CHE algorithm 300 may further sort the weights, for example, from highest to lowest weights in descending order of weight (320). The CHE algorithm 300 may further generate a tree (such as a Huffman tree) (330). To generate the tree, the compression circuitry 110 may position the lowest-weighted symbols at initial leaf child nodes and add these together to generate intermediate parent nodes that represent other more-heavily-weighted symbols, and so on, recursively, up the tree until a node for the heaviest-weighted symbol is positioned at the apex of the tree. Accordingly, in the example in FIG. 3A, symbols 510 and 511 are lowest weighted and are thus positioned at the extreme leaf child nodes, symbols 512 is their parent, and intermediate node, and so on up until symbol 1022 is the at the apex and thus the heaviest weighted node. The CHE algorithm 300 may use a series of tables, matrices, or other data structure to assign the weights and build the tree while tracking weights and positions within the tree.

With further reference to FIG. 3B, the CHE algorithm 300 may, after tree construction, traverse the tree and update the depths of each node in the tree for corresponding symbols (340). For example, as illustrated, each level of nodes when descending down the tree is incremented by a depth of one more level. So, the topmost node with symbol 1022 has a depth of zero and the bottommost nodes with symbols 510 and 511 have a depth of 16. The CHE algorithm 300 may then create Huffman codes based on depth (350). More specifically, the farther down the Huffman tree (e.g., the deeper the depth) a symbol is located, the longer the Huffman code that will be generated. This is by design so that the least-frequently detected symbols are encoded with the longest codes (and thus more expensive to store) while the most-frequently detected symbols are encoded with the shortest codes (and thus the least expensive to store). A leaf depth exceeding 15 bits may trigger a length-limitation operation to ensure generation of standard compliant Huffman codes.

Accordingly, the Deflate standard of compression and decompression likewise dictates that these codes that characterize symbol location within the Huffman tree are each to be 15 bits or smaller. But, as illustrated, symbols 510 and 511 each have a depth of 16 and thus need a 16-bit code to be represented. The larger number of codes there are, the higher likelihood some of the codes will be larger than 15 bits. As discussed, these codes are shortened to comply with requirements of emerging compression standards that employ Deflate. Conventionally, the shortening of the codes is performed by reducing the weights (also referred to as frequency range pruning), which may be performed by recursively shifting the bits to right for each weight, e.g., by halving each weight. The weight sorting, tree generation, depth updates, and Huffman code creation have to all be redone after such pruning, however, which is very expensive computationally to redo.

This frequency-pruning approach not only incurs significant latency overhead, but also necessitates storing the original symbol frequencies until completion of the CHE algorithm, requiring additional logic to perform such storage. Furthermore, the number of recursions needed may be arbitrarily large in certain scenarios, for example, where symbol frequency distribution imitates a Fibonacci series. The presence of large number of symbols (e.g., 512 for Microsoft's Xpress and up to 704 for Google's Brotli) in emerging standards exacerbates this performance penalty because of the need for more frequent length limitation.

Instead of restarting the code generation process from the beginning on detecting the need for length limitation, the disclosed approach opportunistically increases a smaller symbol length (x) to 15 (maximum limit on code length), generating encoding space for $2^{(15-x)}-1$ new codes (see Table 2). The specific symbol is optimally chosen that creates enough space to accommodate all codes that require length limitation. The Huffman code generation process proceeds as normal without incurring any latency overhead. For advanced standards like Xpress and Brotli, the newly generated sub-tree is further optimized by eliminating unused encoding space to generate a more optimal standard-compliant tree. Unlike prior solutions that incur an non-deterministic latency penalty for length limitation, the disclosed solution provides CHE convergence without additional latency for cases where up to about 15% of participating symbols exceed maximum code length. For other scenarios where a greater percentage of symbols exceed the maximum code length, the compression circuitry 110 may employ a hybrid approach that uses frequency range pruning in conjunction with the disclosed opportunistic code-length swapping to length-limit a Huffman tree, as will be explained with reference to FIG. 4.

Figure 4:
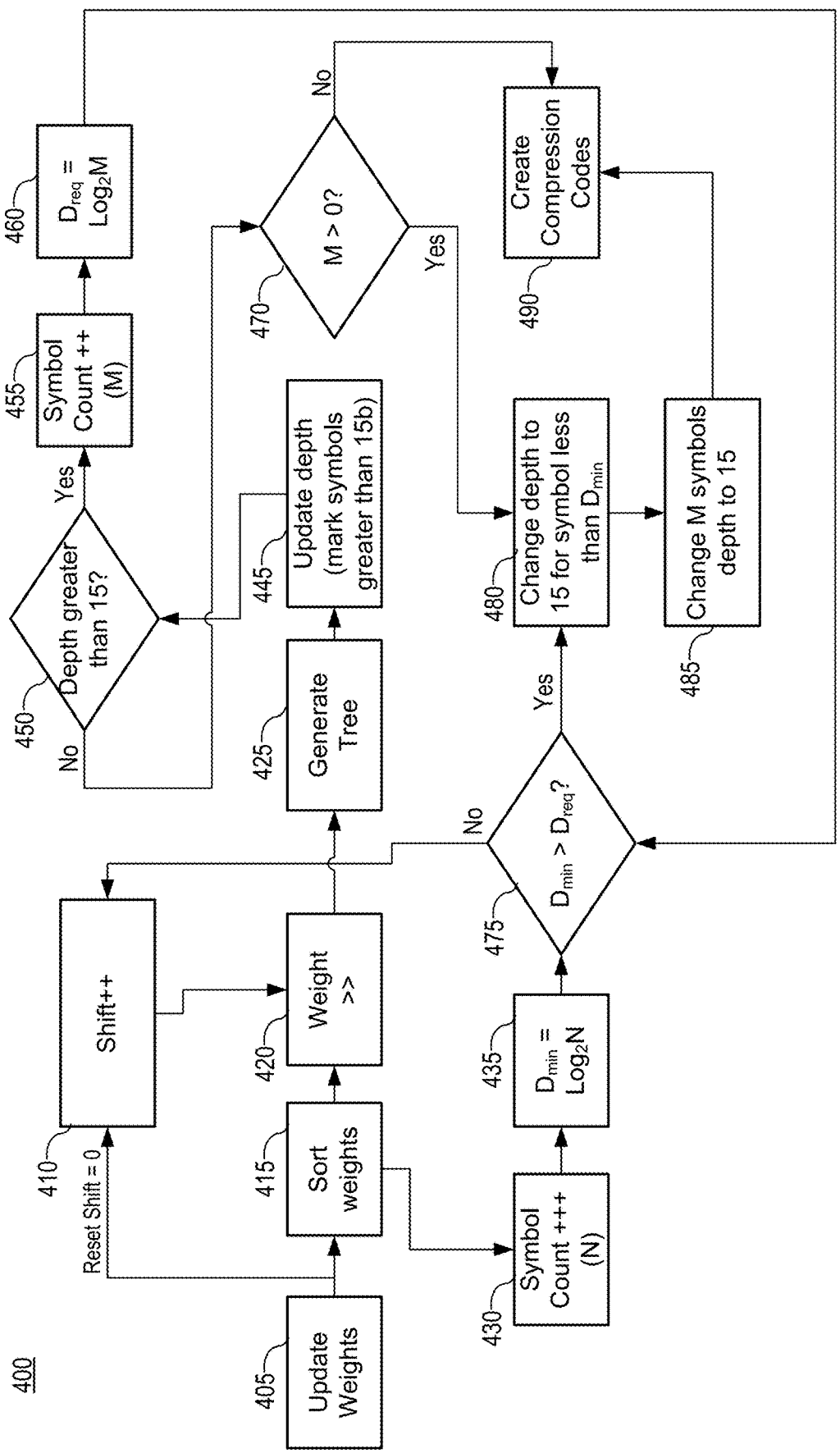
FIG. 4 is a flow chart of a method for deploying compression circuitry in efficient length limiting of compression codes according to various embodiments.

FIG. 4 is a flow chart of a method 400 for deploying compression circuitry in efficient length limiting of compression codes according to various embodiments. The method 400 may be executed using the processing device 100 and in particular the compression circuitry 110, which may be implemented with processing logic in software, firmware, hardware, or a combination thereof. The method 400 is one exemplary embodiment focused on analyzing the symbols and depth within an encoding tree, but as will be discussed in more detail with reference to FIGS. 6-8, other methods are envisioned that analyze and update the Huffman codes directly.

With reference to FIG. 4, the method 400 may begin with the processing logic updating index weights of the various symbols (see block 310 in FIG. 3A) (405). The method 400 may continue with the processing logic sorting the weights (see block 320 in FIG. 3A) (415). In some cases, which will be discussed in more detail with reference to blocks 410 and 420, if the present length limiting process does not work, then the hybrid approach introduced above may allow reverting to the weight reduction approach.

After updating the weights, the method 400 may continue with the processing logic resetting a bit in a register that enables weight shifting (e.g., frequency pruning) to zero (410). This reset of the register value may ensure that no right shift occurs to prune the frequency range of the symbols (420). The method 400 may continue with generating the Huffman tree (see block 330 in FIG. 3A) (425). Concurrently, after sorting the weights, the method 400 may also proceed with incrementing a first hardware counter (e.g., of the set of hardware counters 246) for each symbol processed, which keeps a count of "N" (430). In other words, the first hardware counter tracks the total number, N, of participating symbols in the compression. The method 400 may continue with the processing logic calculating the logarithm base two ($Log_2$) of N to determine an upper-bound of a minimum code length ($D_{min}$) for a distribution of the symbols, N (435).

With continued reference to FIG. 4, the method 400 may continue concurrently with the processing logic updating depth values in the Huffman tree that was generated at block 425, e.g., which may also include marking symbols that are greater than the maximum length (e.g., 15 bits) (445). The marking may be performed by applying a tag (or other marker) to each symbol from the Huffman tree that has a depth greater than 15. The method 400 may continue with the processing logic determining whether the depth of respective symbol, as it is processed, is greater than the maximum length of a corresponding Huffman code, e.g., 15 (450). If there are no symbols (or no more symbols) with a depth greater than the maximum depth, the method 400 may continue with the processing logic determining whether M is greater than zero (470). If, however, there are symbols with a depth greater than 15 in the Huffman tree, the method 400 may continue with incrementing a second hardware counter that is increased each time a new symbol exceeds this depth, to generate the count of "M" symbols (455). The method 400 may continue with the processing logic taking the logarithm base (Log 2) of M to determine the maximum code length ($D_{req}$) needed to encode the M symbols using the 15 bit codes (460).

The method 400 may continue once the symbols of the generated tree have been processed and the processing logic knows the values of $D_{min}$ (minimum code length) and $D_{req}$ (maximum code length). Specifically, the method may continue with the processing logic (assuming that M is greater than zero at block 470) determining whether the minimum code length is greater than the maximum code length (475). If it is not, then the compression circuitry 110 has found a rare case in which the number of codes to be generated that need length limitation exceed the capacity available by increasing the length of a shorter code. In this situation, the method 400 may continue with, in response to a determination that the minimum code length is not greater than the maximum code length, the processing logic setting a bit in the register (410) to trigger frequency pruning in which the weights will be shifted to the right (420). In this situation, the compression circuitry 110 is to regenerate the tree and Huffman codes, as was discussed previously.

If, however, at block 475, the minimum code length is greater than the maximum code length, the method 400 may continue with the processing logic increasing the depth of a symbol that is less than the minimum code length, which may be associated with a short code (480). A short code may be any code that is less than the maximum code length (e.g., 15) or any symbol whose depth in an encoding tree is less than a maximum depth.

The method may continue with the processing logic changing the M symbols, e.g., the symbols with a depth greater than the maximum length, to a maximum depth (485). In the present embodiment, the maximum length of the codes is the same as the maximum depth within the Huffman encoding tree, which is 15 for the Deflate standard of compression and decompression. Another maximum length and/or maximum depth may be chosen for other compression standards. The increase in depth at block 480 and the decrease in depth at block 485 may be referred to as generating a set of code-length converted values. The method 400 may continue with the processing logic generating compression codes (e.g., Huffman codes) using the code-length converted values (490). In this way, unless the rare case in which the condition at block 475 (that the minimum code length is greater than the maximum code length) is not met, the method 400 may carry out code-length limitations without having to perform weight frequency pruning and regeneration of the encoding tree to perform the compression.

TABLE 2

| Code | Encoding Space |
|---|---|
| 1 | 16383 |
| 2 | 8191 |
| 3 | 4095 |
| 4 | 2047 |
| 5 | 1023 |
| 6 | 511 |
| 7 | 255 |
| 8 | 127 |
| 9 | 63 |
| 10 | 31 |
| 11 | 15 |
| 12 | 7 |
| 13 | 3 |
| 14 | 1 |

Comparing minimum code length ($D_{min}$) with the maximum code length ($D_{req}$) indicates the presence of a short code whose conversion to a 15-bit code enables length limiting within the Huffman tree without requiring a reconstruction. As illustrated in Table 2, when any code that is less than 15 bits is lengthened to 15 bits, the encoding space that is freed up is indicated in the right column, which is $2^{(15-x)}-1$. So, for example, if a code of length 7 bits is increased to 15-bit encoding, 255 additional 15-bit codes become available for encoding.

Figure 5:
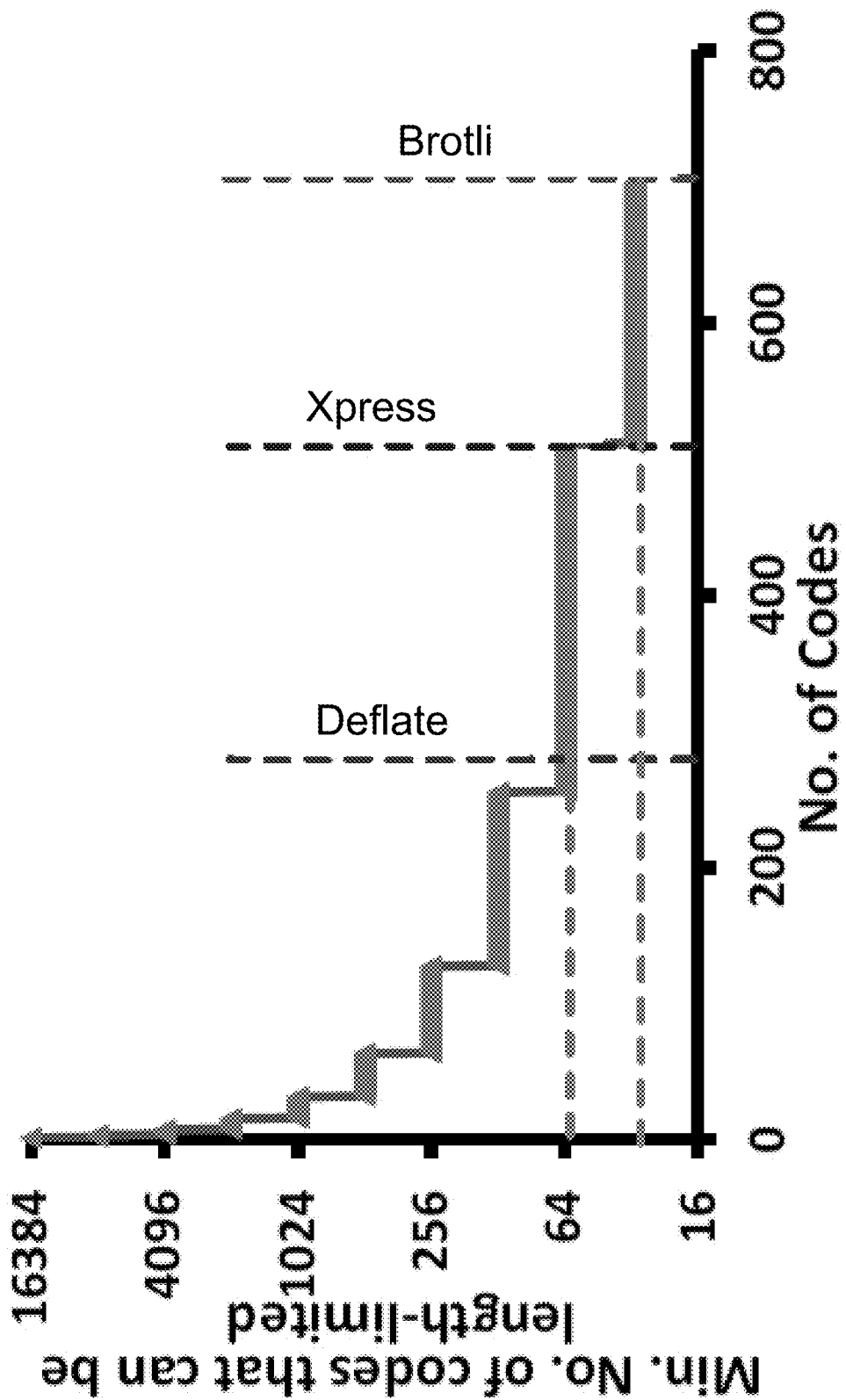
FIG. 5 is a data chart illustrating a minimum number of symbols that can be length-limited with proposed techniques for Deflate, Xpress, and Brotli standards according to an embodiment.

FIG. 5 is a data chart illustrating a minimum number of symbols that can be length-limited with proposed techniques for Deflate, Xpress, and Brotli standards according to an embodiment. In various embodiments, the minimum number of codes exceeding 15 bits that can be converted into a 15-bit code with the proposed scheme increases with decreasing number of participating symbols. For example, if the distance tree in Deflate includes 30 symbols, the minimum number of longer codes that can be fixed is 1023, thus very likely eliminating the need for any recursive frequency pruning. Careful analysis shows that most of the smaller Huffman trees in a Brotli header can also exploit this feature providing for length limitation without tree reconstruction. In the worst case scenario for the three standards, the literal-length for DEFLATE, literal-copy for Xpress, and insert-copy for Brotli, at least 63, 63, and 31, respectively, longer codes can be lengthened with this approach, enabling faster CHE. For extremely rare scenarios where the number of codes that need length-limitation exceed these limits, a hybrid approach that uses frequency range pruning in conjunction with subsequent code-length conversion can be used, which has been discussed.

Figure 6:
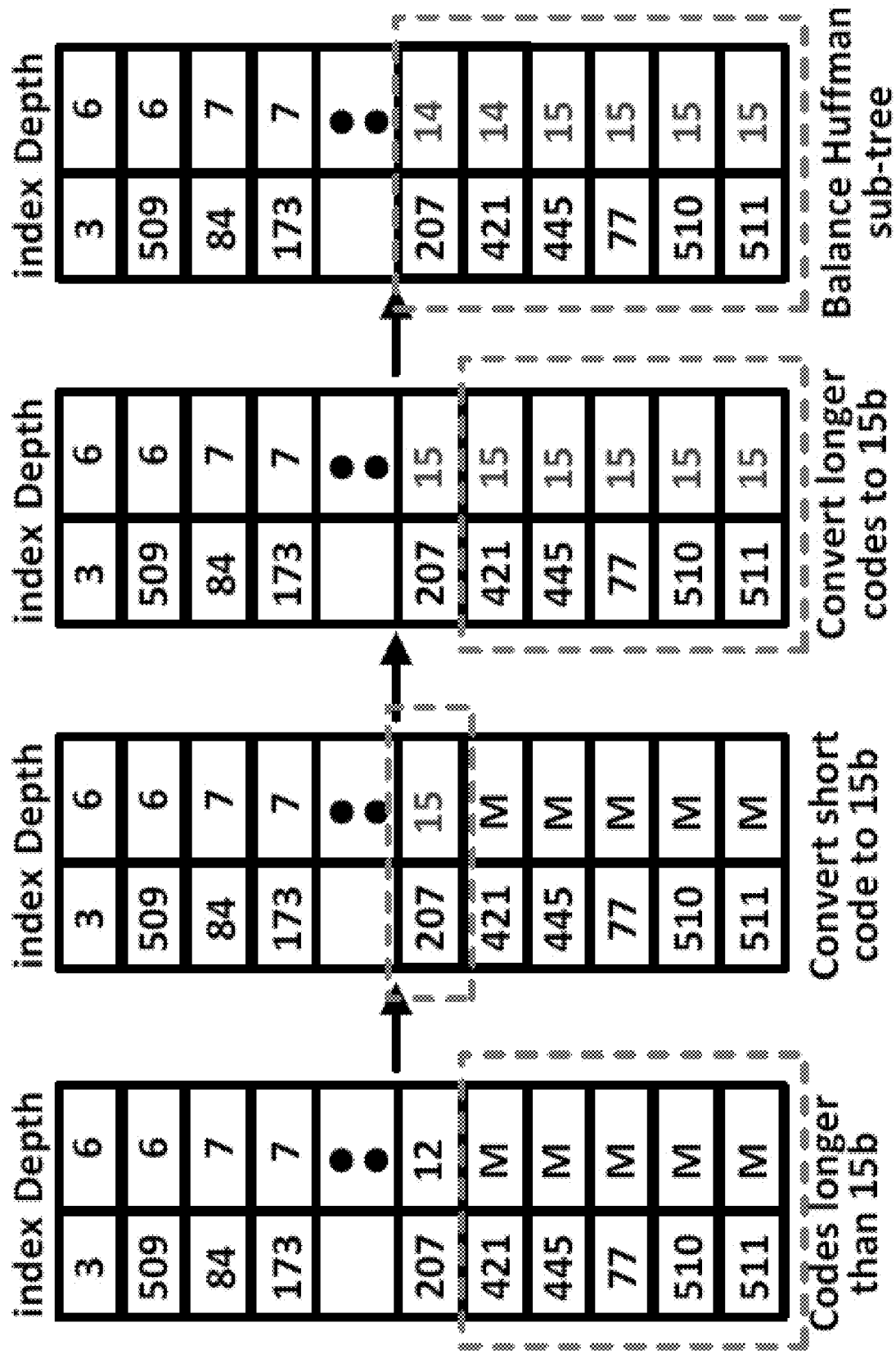
FIG. 6 is a set of tables illustrating an example of length limitations of longer Huffman codes according to an embodiment.

FIG. 6 is a set of tables illustrating an example of length limitations of longer Huffman codes according to an embodiment. The symbols "M" at the bottom of the first two columns are those that have a depth that exceed the minimum depth of 15. By increasing the depth of symbol 207 from 12 to 15, capacity for an additional seven 15-bit codes is generated as illustrated in Table 2. Accordingly, the five symbols whose depth exceeds the maximum depth are indexed at the maximum depth, e.g., 15.

Figure 7:
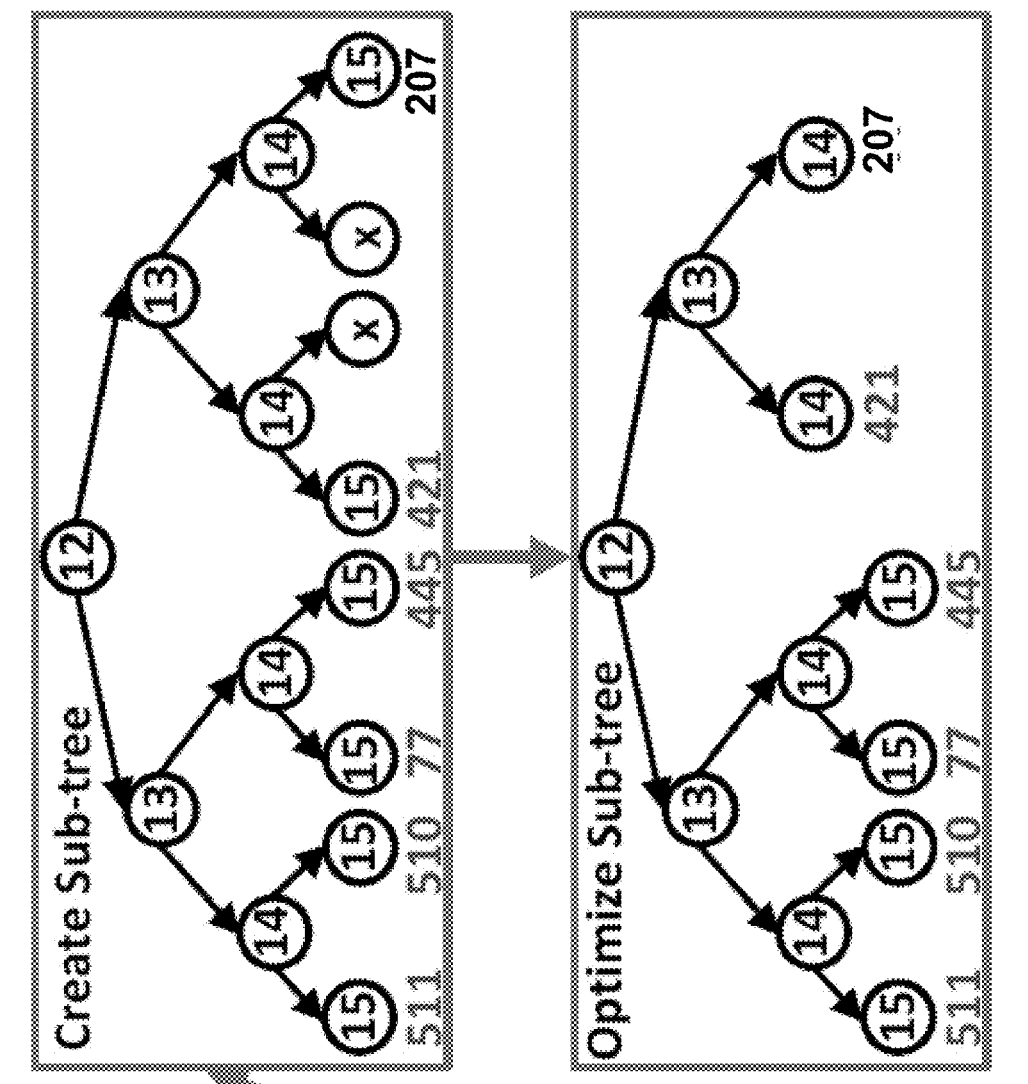
FIG. 7 is an example Huffman tree with two example sub-trees that illustrate limiting length of previously lengthened codes according to an embodiment of the disclosure.
Figure 7:
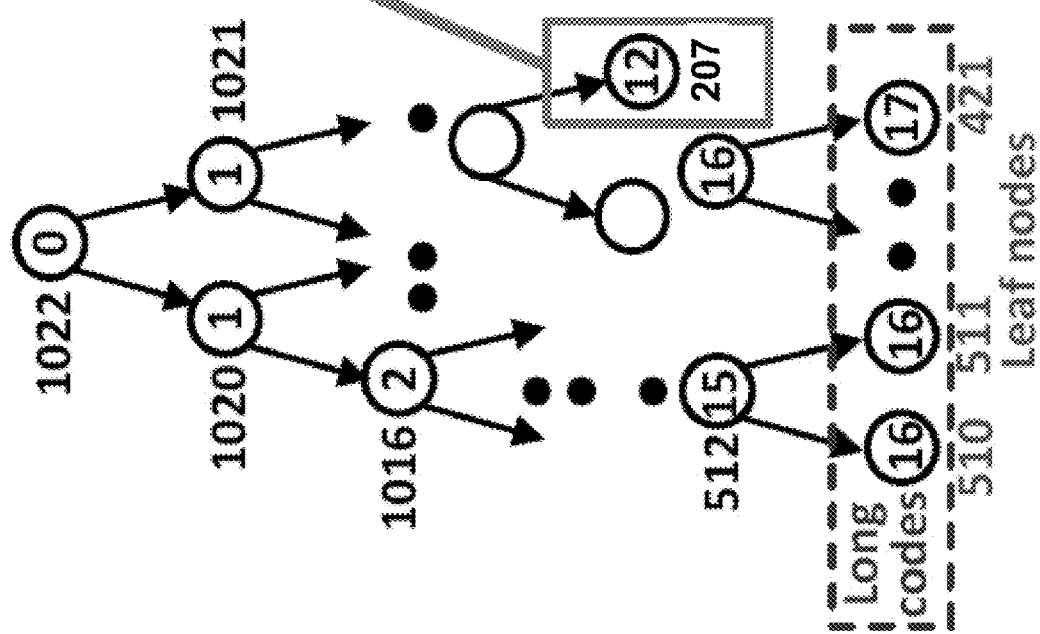

FIG. 7 is an example Huffman tree with two example sub-trees that illustrate limiting length of previously lengthened codes according to an embodiment of the disclosure. The example of FIG. 7 extends the encoding process of FIG. 6 to tree generation. As illustrated, the long codes (symbols with a tree depth of 16 and 17) may be encoded with codes of 15 after the code depth of symbol 207 is increased from 12 to 15. Because now there is capacity for eight 15-bit codes (seven additional plus the one for symbol 207), and only six are being used, there are two nodes (identified by an "x" in the initial sub-tree) that are empty. To generate a Huffman tree that fully exhausts the encoding range (such as required by Xpress and Brotli), the Huffman sub-tree may be further optimized by removing the unused nodes, and compressing the child nodes at depth 15 into the parents at depth 14 (e.g., for symbols 421 and 207). This change is also reflected in the last table in FIG. 6 labeled "balance Huffman sub-tree."

Accordingly, instead of using a conventional approach that does a recursive halving to prune the frequency range of all weights, the disclosed approach may adaptively accelerate the pruning in accordance with the number of codes that require length-limitation. For scenarios like Brotli's insert-copy Huffman tree that has 704 symbols, if a large number of codes exceed 15 bits, the compression circuitry 110 may aggressively prune the tree with division by 4 or division by 8 to ensure that length limitation is accomplished with a single iteration. Any further length limiting may then be performed by the disclosed code-length conversions that modify the fewest number of existing weights/depths to balance needed capacity. The use of this adaptive hybrid approach may be extended to software implementations as well, where the rarely employed recursive division is done in software while the code-substitution and sub-tree balancing is done in hardware.

Furthermore, conventional recursive division approach may use an increment by one ("1") in addition to right-shift ((frequency >>shift)+1) to ensure non-zero frequencies are not zeroed out. One may use a more efficient implementation that computes "(frequency >>shift)|1'b1," which may also be expressed as an "OR" Boolean operation, thus eliminating an adder from the critical path.

The Huffman tree generated after converting a short code to 15 bits to accommodate the longer codes does not necessarily exhaust the entire 15-bit encoding space. Such a tree is Deflate compliant (does not optimally compress the symbols though), and no additional processing is required for compressing the payload. However, in other embodiments, Xpress and Brotli standards may require a Huffman tree that fully exhausts the encoding range, and hence calls for an additional step to condense the tree to generate a standard compliant tree as shown in the "balance Huffman sub-tree" of FIG. 6 and the "Optimize Sub-tree" of FIG. 7. The disclosed length-limitation mechanism replaces a node in the original tree with a sub-tree whose leaf nodes constitute symbols whose codes exceeded the maximum permissible length. The sub-tree condensation mechanism eliminates floating leaf nodes (marked as "x" in FIG. 7), thereby substituting its parent with the other child. Because this step does not alter the remaining nodes of the original tree, it can be performed concurrently with Huffman code generation without incurring additional delay.

In other embodiments, the compression circuitry 110 is further to determine that the increased encoding capacity (from increasing a code length of a short symbol) includes a subset of 15-bit codes that are numbered more than a first set of symbols, M. The compression circuitry 110 may further decrease, back to an original code length, the subset of 15-bits codes to encode as many of the multiple symbols with a fewest possible number of bits.

Figure 8:
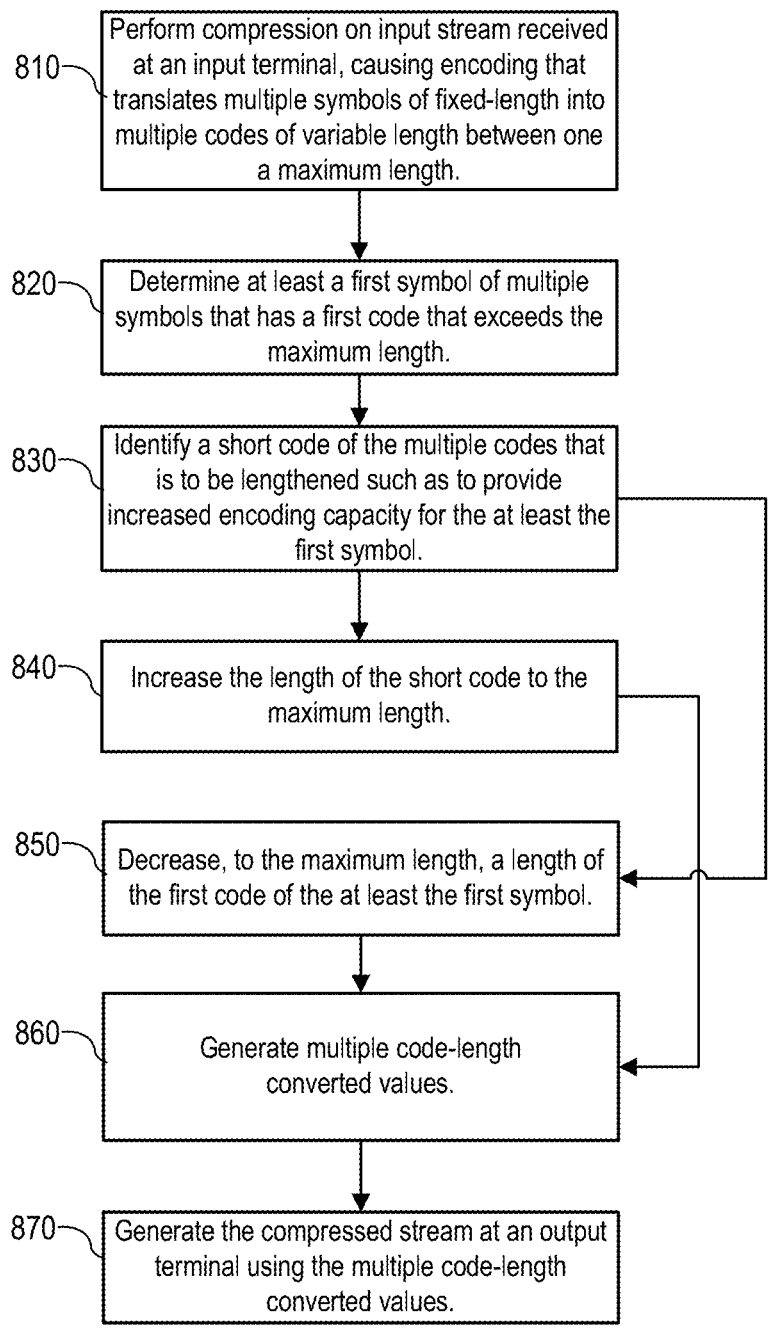
FIG. 8 is a flow chart of a method for efficient length limitation of compression codes according to various embodiments.

FIG. 8 is a flow chart of a method 800 for efficient length limitation of compression codes according to various embodiments. The method 800 may be executed using the processing device 100 and in particular the compression circuitry 110, which may be implemented with processing logic in software, firmware, hardware, or a combination thereof. The software may run directly on the processing device while the hardware may be embodied within the compression circuitry 110 as depicted in FIGS. 1-2.

The method 800 may begin with the processing logic performing compression on an input stream of data received on an input terminal (810). Performing compression may include encoding the input stream with an encoding that translates multiple symbols of fixed length into multiple codes of variable length between one and a maximum length. The method may continue with the processing logic determining at least a first symbol of the multiple symbols has a first code that exceeds the maximum length (820). The number of symbols whose code exceeds the maximum length may include a set of symbols, M. The method 800 may continue with the processing logic identifying a short code of the multiple codes that is to be lengthened such as to provide increased encoding capacity for the at least the first symbol (or the set of symbols, M), the short code having a length less than the maximum length (830).

With additional reference to FIG. 8, the method 800 may continue with the processing logic increasing the length of the short code to the maximum length (840). The method 800 may continue with the processing logic decreasing, to the maximum length, a length of the first code of the at least the first symbol (850). The increasing in block 840 and the decreasing in block 850 may be referred to as generating a set of, or multiple, code-length converted values (860). As described above, this conversion may be for a single short code but may extend to multiple symbols whose depth in the Huffman tree would equate to a Huffman code that exceeds the maximum length. The method 800 may continue with the processing logic generating, with use of the multiple code-length converted values, the compressed stream at an output terminal (870).

In one embodiment, lengths of the multiple codes depend on a depth within an encoding tree (e.g., of a Huffman tree when using CHE) of respective symbols of the multiple symbols. Accordingly, to increase the length of the short code to the maximum length, the compression circuitry may increase a depth of a second symbol within the encoding tree to a maximum depth, the second symbol being associated with the short code. Furthermore, to decrease, to the maximum length, the length of the first code (or the set of "M" symbols), the compression circuitry is to change a depth, within the encoding tree, of the at least the first symbol to a maximum depth associated with the maximum length.

If after performing the features of the method 800 of FIG. 8, further compression is possible, the method 800 may be extended to include the processing logic: (1) determining that at least a first value of the set of code-length converted values is associated with a symbol assigned to a single child node off of a parent node in an encoding sub-tree, wherein a second value of the parent node is smaller than the first value; (2) eliminating the child node; and (3) assigning the symbol to the parent node, which thus assumes the second value of the code-length converted values. The result of this further optimization may be visualized in the "balance Huffman sub-tree" of FIG. 6 and the "Optimize Sub-tree" of FIG. 7.

FIG. 9A is a block diagram illustrating a micro-architecture for a processor 900 that implements the processing device including heterogeneous cores in accordance with one embodiment of the disclosure. Specifically, processor 900 depicts an in-order architecture core and a register renaming logic, out-of-order issue/execution logic to be included in a processor according to at least one embodiment of the disclosure.

Processor 900 includes a front end unit 930 coupled to an execution engine unit 950, and both are coupled to a memory unit 970. The processor 900 may include a reduced instruction set computing (RISC) core, a complex instruction set computing (CISC) core, a very long instruction word (VLIW) core, or a hybrid or alternative core type. As yet another option, processor 900 may include a special-purpose core, such as, for example, a network or communication core, compression engine, graphics core, or the like. In one embodiment, processor 900 may be a multi-core processor or may be part of a multi-processor system.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 940 may be implemented using various different mechanisms. Examples of suitable mechanisms include, but are not limited to, look-up tables, hardware implementations, programmable logic arrays (PLAs), microcode read only memories (ROMs), etc. The instruction cache unit 934 is further coupled to the memory unit 970. The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations (RS), central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 958 is overlapped by the retirement unit 954 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

In one implementation, processor 900 may be the same as the processor 102 as described with respect to FIGS. 1 and 2.

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which may include a data prefetcher 980, a data TLB unit 972, a data cache unit (DCU) 974, and a level 2 (L2) cache unit 976, to name a few examples. In some embodiments DCU 974 is also known as a first level data cache (L1 cache). The DCU 974 may handle multiple outstanding cache misses and continue to service incoming stores and loads. It also supports maintaining cache coherency. The data TLB unit 972 is a cache used to improve virtual address translation speed by mapping virtual and physical address spaces. In one exemplary embodiment, the memory access units 964 may include a load unit, a store address unit, and a store data unit, each of which is coupled to the data TLB unit 972 in the memory unit 970. The L2 cache unit 976 may be coupled to one or more other levels of cache and eventually to a main memory.

In one embodiment, the data prefetcher 980 speculatively loads/prefetches data to the DCU 974 by automatically predicting which data a program is about to consume. Prefeteching may refer to transferring data stored in one memory location of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 900 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 9B is a block diagram illustrating an in-order pipeline and a register renaming stage, out-of-order issue/execution pipeline implemented by processor 900 of FIG. 9A according to some embodiments of the disclosure. The solid lined boxes in FIG. 9B illustrate an in-order pipeline, while the dashed lined boxes illustrates a register renaming, out-of-order issue/execution pipeline. In FIG. 9B, a processor 900 as a pipeline includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924. In some embodiments, the ordering of stages 902-924 may be different than illustrated and are not limited to the specific ordering shown in FIG. 9B.

Figure 10:
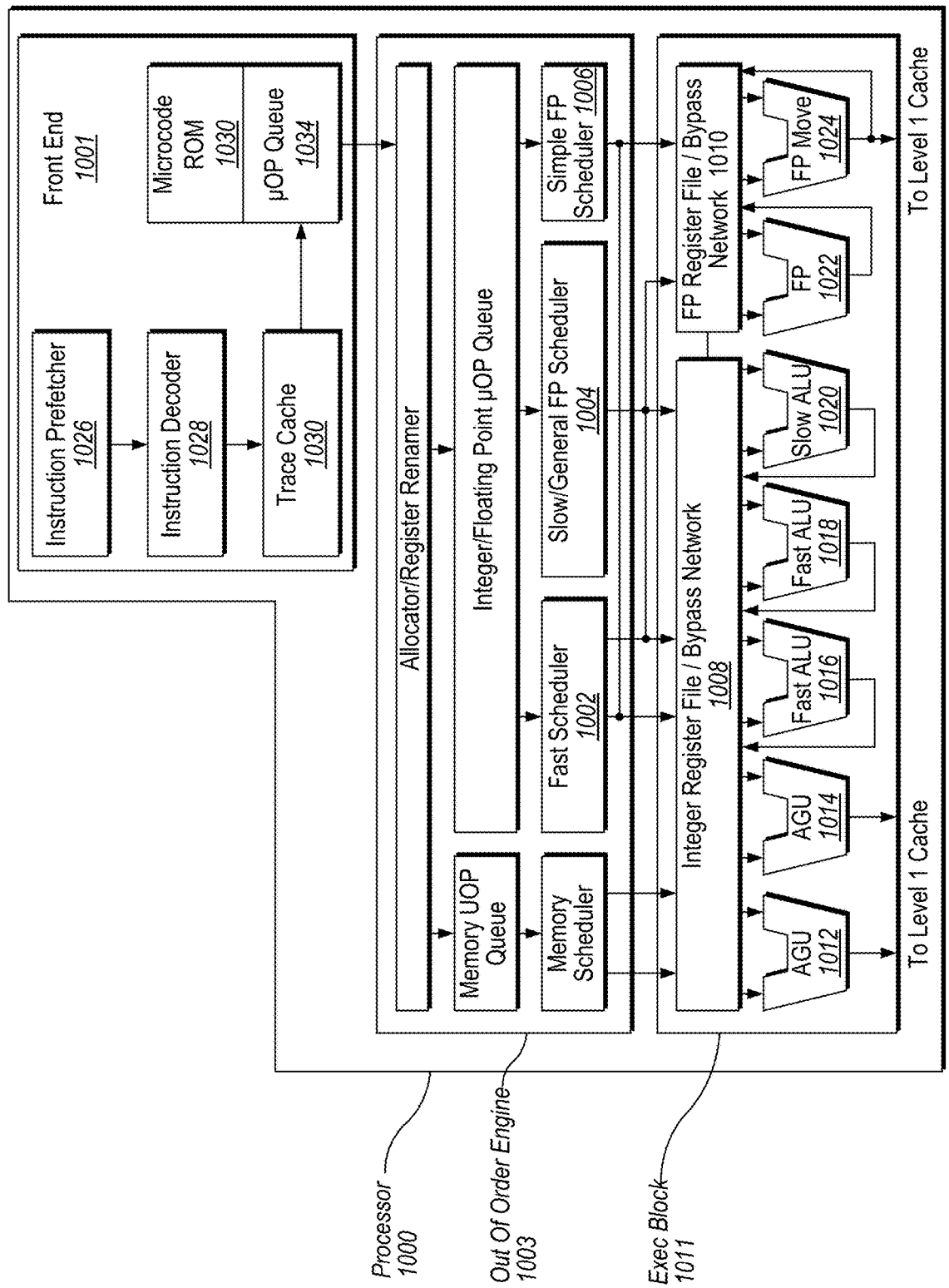
FIG. 10 is a block diagram illustrating a micro-architecture for a processor in accordance with one embodiment of the disclosure.

FIG. 10 illustrates a block diagram of the micro-architecture for a processor 1000 (e.g., processing device 100) that includes hybrid cores in accordance with one embodiment of the disclosure. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 1001 is the part of the processor 1000 that fetches instructions to be executed and prepares them to be used later in the processor pipeline.

The front end 1001 may include several units. In one embodiment, the instruction prefetcher 1026 fetches instructions from memory and feeds them to an instruction decoder 1028 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 1030 takes decoded uops and assembles them into program ordered sequences or traces in the uop queue 1034 for execution. When the trace cache 1030 encounters a complex instruction, the microcode ROM 1032 provides the uops needed to complete the operation.

Some instructions are converted into a single micro-op, whereas others need several micro-ops to complete the full operation. In one embodiment, if more than four micro-ops are needed to complete an instruction, the decoder 1028 accesses the microcode ROM 1032 to do the instruction. For one embodiment, an instruction can be decoded into a small number of micro ops for processing at the instruction decoder 1028. In another embodiment, an instruction can be stored within the microcode ROM 1032 should a number of micro-ops be needed to accomplish the operation. The trace cache 1030 refers to an entry point programmable logic array (PLA) to determine a correct micro-instruction pointer for reading the micro-code sequences to complete one or more instructions in accordance with one embodiment from the micro-code ROM 1032. After the microcode ROM 1032 finishes sequencing micro-ops for an instruction, the front end 1001 of the machine resumes fetching micro-ops from the trace cache 1030.

The out-of-order execution engine 1003 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 1002, slow/general floating point scheduler 1004, and simple floating point scheduler 1006. The uop schedulers 1002, 1004, 1006, determine when a uop is ready to execute based on the readiness of their dependent input register operand sources and the availability of the execution resources the uops need to complete their operation. The fast scheduler 1002 of one embodiment can schedule on each half of the main clock cycle while the other schedulers can only schedule once per main processor clock cycle. The schedulers arbitrate for the dispatch ports to schedule uops for execution.

Register files 1008, 1010, sit between the schedulers 1002, 1004, 1006, and the execution units 1012, 1014, 1016, 1018, 1020, 1022, 1024 in the execution block 1011. There is a separate register file 1008, 1010, for integer and floating point operations, respectively. Each register file 1008, 1010, of one embodiment also includes a bypass network that can bypass or forward just completed results that have not yet been written into the register file to new dependent uops. The integer register file 1008 and the floating point register file 1010 are also capable of communicating data with the other. For one embodiment, the integer register file 1008 is split into two separate register files, one register file for the low order 32 bits of data and a second register file for the high order 32 bits of data. The floating point register file 1010 of one embodiment has 128 bit wide entries because floating point instructions typically have operands from 64 to 128 bits in width.

The execution block 1011 contains the execution units 1012, 1014, 1016, 1018, 1020, 1022, 1024, where the instructions are actually executed. This section includes the register files 1008, 1010, that store the integer and floating point data operand values that the micro-instructions need to execute. The processor 1000 of one embodiment is comprised of a number of execution units: address generation unit (AGU) 1012, AGU 1014, fast ALU 1016, fast ALU 1018, slow ALU 1020, floating point ALU 1022, floating point move unit 1024. For one embodiment, the floating point execution blocks 1022, 1024, execute floating point, MMX, SIMD, and SSE, or other operations. The floating point ALU 1022 of one embodiment includes a 64 bit by 64 bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 1016, 1018. The fast ALUs 1016, 1018, of one embodiment can execute fast operations with an effective latency of half a clock cycle. For one embodiment, most complex integer operations go to the slow ALU 1020 as the slow ALU 1020 includes integer execution hardware for long latency type of operations, such as a multiplier, shifts, flag logic, and branch processing. Memory load/store operations are executed by the AGUs 1012, 1014. For one embodiment, the integer ALUs 1016, 1018, 1020, are described in the context of performing integer operations on 64 bit data operands. In alternative embodiments, the ALUs 1016, 1018, 1020, can be implemented to support a variety of data bits including 16, 32, 128, 256, etc. Similarly, the floating point units 1022, 1024, can be implemented to support a range of operands having bits of various widths. For one embodiment, the floating point units 1022, 1024, can operate on 128 bits wide packed data operands in conjunction with SIMD and multimedia instructions.

In one embodiment, the uops schedulers 1002, 1004, 1006, dispatch dependent operations before the parent load has finished executing. As uops are speculatively scheduled and executed in processor 1000, the processor 1000 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 1000 also includes logic to implement store address prediction for memory disambiguation according to embodiments of the disclosure. In one embodiment, the execution block 1011 of processor 1000 may include a store address predictor (not shown) for implementing store address prediction for memory disambiguation.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions below, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 11:
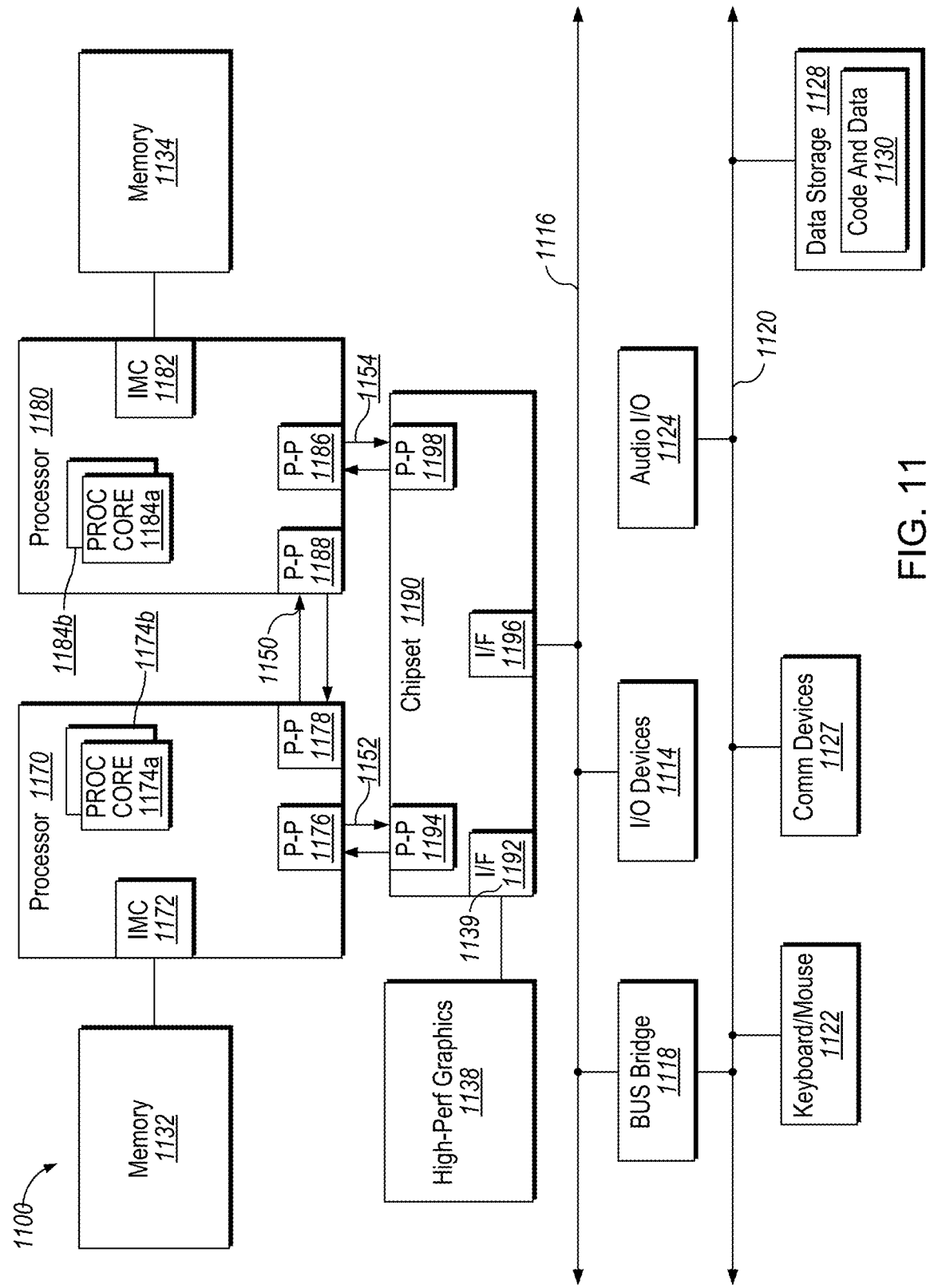
FIG. 11 is a block diagram illustrating a system in which an embodiment of the disclosure may be used.

Referring now to FIG. 11, shown is a block diagram illustrating a system 1100 in which an embodiment of the disclosure may be used. As shown in FIG. 11, multiprocessor system 1100 is a point-to-point interconnect system, and includes a first processor 1170 and a second processor 1180 coupled via a point-to-point interconnect 1150. While shown with only two processors 1170, 1180, it is to be understood that the scope of embodiments of the disclosure is not so limited. In other embodiments, one or more additional processors may be present in a given processor. In one embodiment, the multiprocessor system 1100 may implement hybrid cores as described herein.

Processors 1170 and 1180 are shown including integrated memory controller units 1172 and 1182, respectively. Processor 1170 also includes as part of its bus controller units point-to-point (P-P) interfaces 1176 and 1178; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 may each exchange information with a chipset 1190 via individual P-P interfaces 1152, 1154 using point to point interface circuits 1176, 1194, 1186, 1198. Chipset 1190 may also exchange information with a high-performance graphics circuit 1138 via a high-performance graphics interface 1139.

A shared cache (not shown) may be included in either processor or outside of both processors, yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus, although the scope of the present disclosure is not so limited.

As shown in FIG. 11, various I/O devices 1114 may be coupled to first bus 1116, along with a bus bridge 1118 which couples first bus 1116 to a second bus 1120. In one embodiment, second bus 1120 may be a low pin count (LPC) bus. Various devices may be coupled to second bus 1120 including, for example, a keyboard and/or mouse 1122, communication devices 1127 and a storage unit 1128 such as a disk drive or other mass storage device which may include instructions/code and data 1130, in one embodiment. Further, an audio I/O 1124 may be coupled to second bus 1120. Note that other architectures are possible. For example, instead of the point-to-point architecture of FIG. 11, a system may implement a multi-drop bus or other such architecture.

Figure 12:
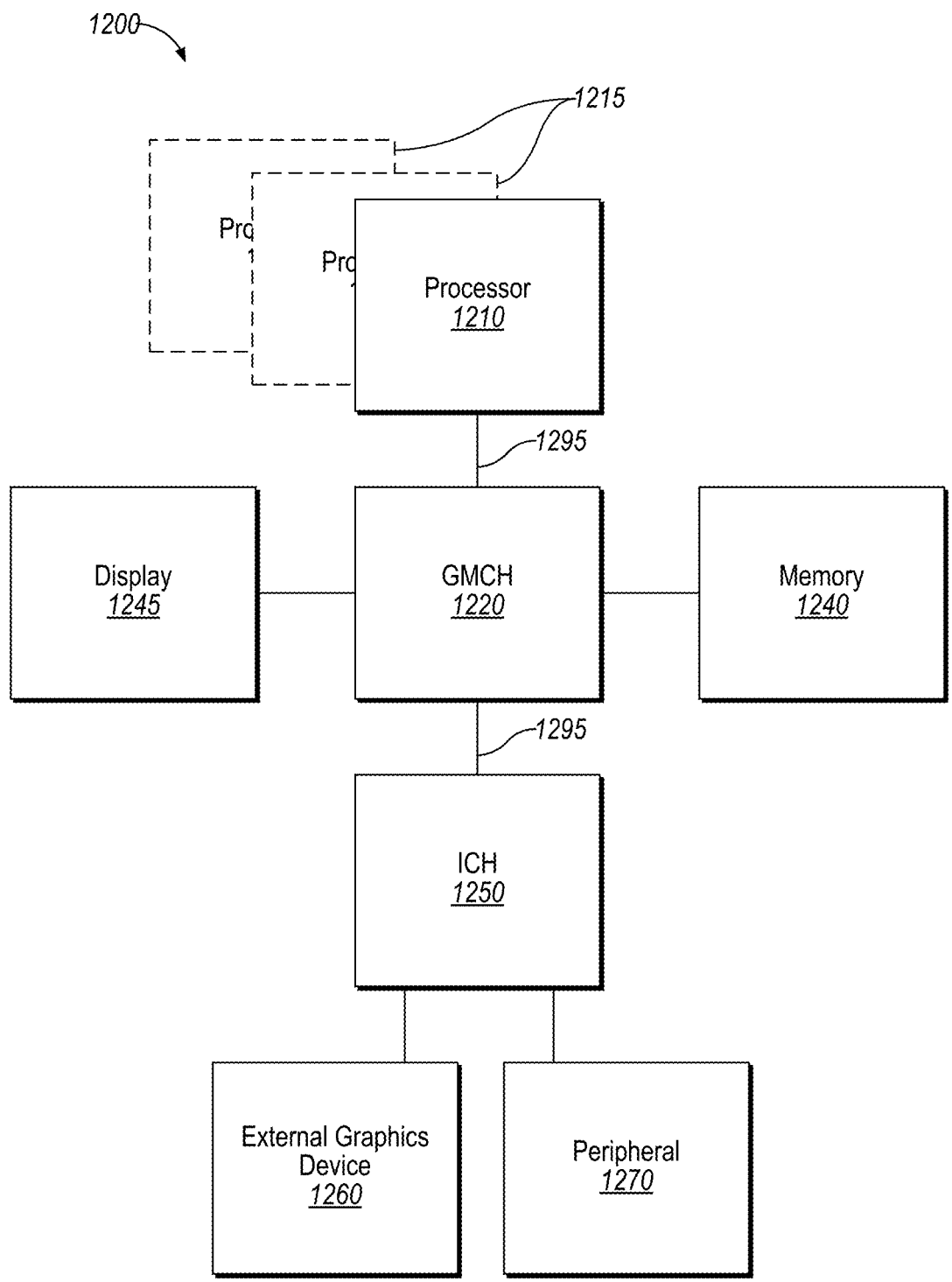
FIG. 12 is a block diagram illustrating a system in which an embodiment of the disclosure may operate.

Referring now to FIG. 12, shown is a block diagram of a system 1200 in which one embodiment of the disclosure may operate. The system 1200 may include one or more processors 1210, 1215, which are coupled to graphics memory controller hub (GMCH) 1220. The optional nature of additional processors 1215 is denoted in FIG. 12 with broken lines. In one embodiment, processors 1210, 1215 implement hybrid cores according to embodiments of the disclosure.

Each processor 1210, 1215 may be some version of the circuit, integrated circuit, processor, and/or silicon integrated circuit as described above. However, it should be noted that it is unlikely that integrated graphics logic and integrated memory control units would exist in the processors 1210, 1215. FIG. 12 illustrates that the GMCH 1220 may be coupled to a memory 1240 that may be, for example, a dynamic random access memory (DRAM). The DRAM may, for at least one embodiment, be associated with a non-volatile cache.

The GMCH 1220 may be a chipset, or a portion of a chipset. The GMCH 1220 may communicate with the processor(s) 1210, 1215 and control interaction between the processor(s) 1210, 1215 and memory 1240. The GMCH 1220 may also act as an accelerated bus interface between the processor(s) 1210, 1215 and other elements of the system 1200. For at least one embodiment, the GMCH 1220 communicates with the processor(s) 1210, 1215 via a multi-drop bus, such as a frontside bus (FSB) 1295.

Furthermore, GMCH 1220 is coupled to a display 1245 (such as a flat panel or touchscreen display). GMCH 1220 may include an integrated graphics accelerator. GMCH 1220 is further coupled to an input/output (I/O) controller hub (ICH) 1250, which may be used to couple various peripheral devices to system 1200. Shown for example in the embodiment of FIG. 12 is an external graphics device 1260, which may be a discrete graphics device, coupled to ICH 1250, along with another peripheral device 1270.

Alternatively, additional or different processors may also be present in the system 1200. For example, additional processor(s) 1215 may include additional processors(s) that are the same as processor 1210, additional processor(s) that are heterogeneous or asymmetric to processor 1210, accelerators (such as, e.g., graphics accelerators or digital signal processing (DSP) units), field programmable gate arrays, or any other processor. There can be a variety of differences between the processor(s) 1210, 1215 in terms of a spectrum of metrics of merit including architectural, micro-architectural, thermal, power consumption characteristics, and the like. These differences may effectively manifest themselves as asymmetry and heterogeneity amongst the processors 1210, 1215. For at least one embodiment, the various processors 1210, 1215 may reside in the same die package.

Figure 13:
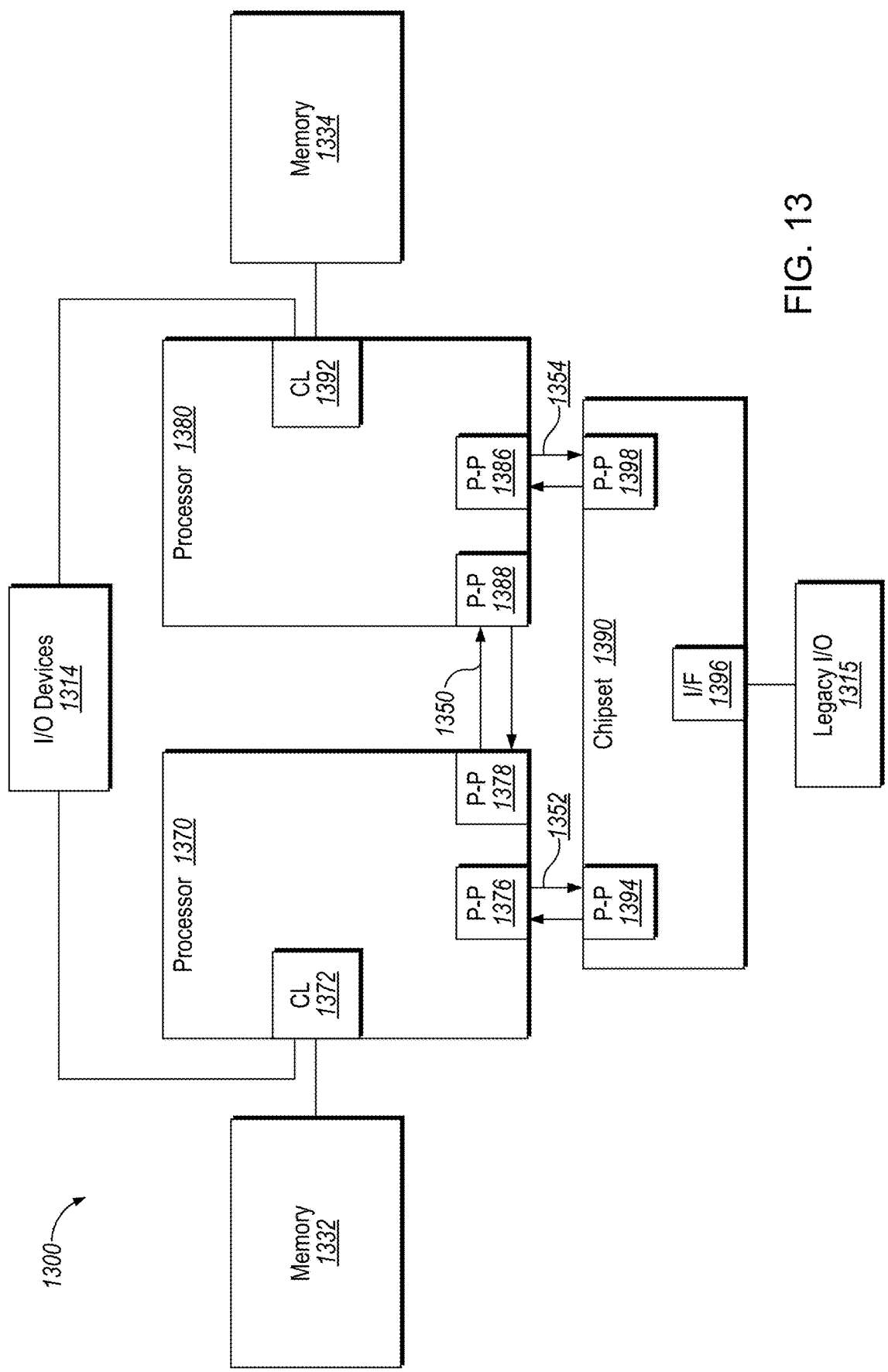
FIG. 13 is a block diagram illustrating a system in which an embodiment of the disclosure may operate.

Referring now to FIG. 13, shown is a block diagram of a system 1300 in which an embodiment of the disclosure may operate. FIG. 13 illustrates processors 1370, 1380. In one embodiment, processors 1370, 1380 may implement hybrid cores as described above. Processors 1370, 1380 may include integrated memory and I/O control logic ("CL") 1372 and 1382, respectively and intercommunicate with each other via point-to-point interconnect 1350 between point-to-point (P-P) interfaces 1378 and 1388 respectively. Processors 1370, 1380 each communicate with chipset 1390 via point-to-point interconnects 1352 and 1354 through the respective P-P interfaces 1376 to 1394 and 1386 to 1398 as shown. For at least one embodiment, the CL 1372, 1382 may include integrated memory controller units. CLs 1372, 1382 may include I/O control logic. As depicted, memories 1332, 1334 coupled to CLs 1372, 1382 and I/O devices 1314 are also coupled to the control logic 1372, 1382. Legacy I/O devices 1315 are coupled to the chipset 1390 via interface 1396.

Figure 14:
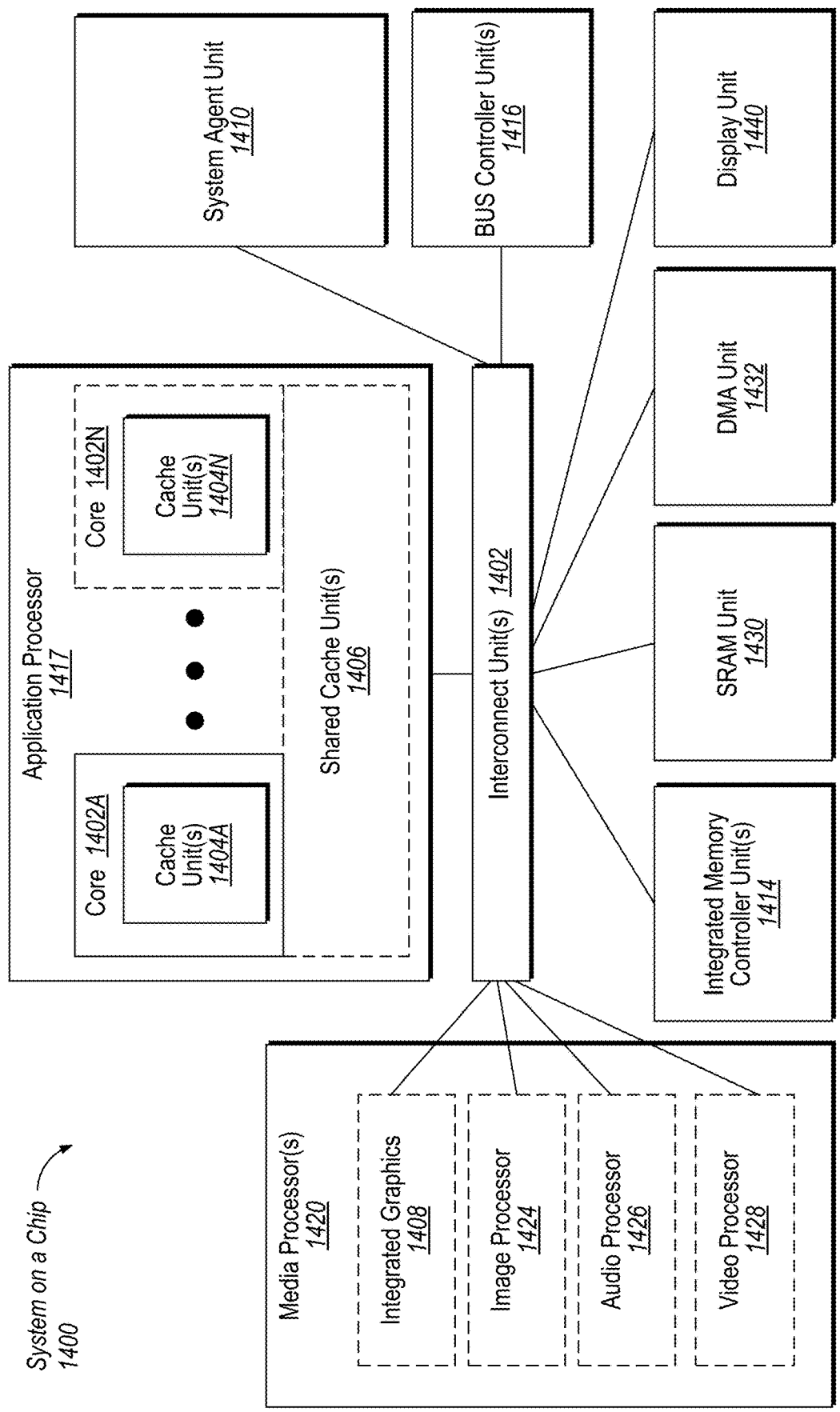
FIG. 14 is a block diagram illustrating a System-on-a-Chip (SoC) according to an embodiment of the disclosure.

Embodiments may be implemented in many different system types. FIG. 14 is a block diagram of a SoC 1400 in accordance with an embodiment of the present disclosure. Dashed lined boxes are optional features on more advanced SoCs. In FIG. 14, an interconnect unit(s) 1412 is coupled to: an application processor 1420 which includes a set of one or more cores 1402A-N and shared cache unit(s) 1406; a system agent unit 1410; a bus controller unit(s) 1416; an integrated memory controller unit(s) 1414; a set or one or more media processors 1418 which may include integrated graphics logic 1408, an image processor 1424 for providing still and/or video camera functionality, an audio processor 1426 for providing hardware audio acceleration, and a video processor 1428 for providing video encode/decode acceleration; an static random access memory (SRAM) unit 1430; a direct memory access (DMA) unit 1432; and a display unit 1440 for coupling to one or more external displays. In one embodiment, a memory module may be included in the integrated memory controller unit(s) 1414. In another embodiment, the memory module may be included in one or more other components of the SoC 1400 that may be used to access and/or control a memory. The application processor 1420 may include a store address predictor for implementing hybrid cores as described in embodiments herein.

The memory hierarchy includes one or more levels of cache within the cores, a set or one or more shared cache units 1406, and external memory (not shown) coupled to the set of integrated memory controller units 1414. The set of shared cache units 1406 may include one or more mid-level caches, such as level 2 (L2), level 3 (L3), level 4 (L4), or other levels of cache, a last level cache (LLC), and/or combinations thereof.

In some embodiments, one or more of the cores 1402A-N are capable of multithreading. The system agent 1410 includes those components coordinating and operating cores 1402A-N. The system agent unit 1410 may include for example a power control unit (PCU) and a display unit. The PCU may be or include logic and components needed for regulating the power state of the cores 1402A-N and the integrated graphics logic 1408. The display unit is for driving one or more externally connected displays.

The cores 1402A-N may be homogenous or heterogeneous in terms of architecture and/or instruction set. For example, some of the cores 1402A-N may be in order while others are out-of-order. As another example, two or more of the cores 1402A-N may be capable of execution the same instruction set, while others may be capable of executing only a subset of that instruction set or a different instruction set.

The application processor 1420 may be a general-purpose processor, such as a Core™ i3, i5, i7, 2 Duo and Quad, Xeon™, Itanium™, Atom™ or Quark™ processor, which are available from Intel™ Corporation, of Santa Clara, Calif. Alternatively, the application processor 1420 may be from another company, such as ARM Holdings™, Ltd, MIPS™, etc. The application processor 1420 may be a special-purpose processor, such as, for example, a network or communication processor, compression engine, graphics processor, co-processor, embedded processor, or the like. The application processor 1420 may be implemented on one or more chips. The application processor 1420 may be a part of and/or may be implemented on one or more substrates using any of a number of process technologies, such as, for example, BiCMOS, CMOS, or NMOS.

Figure 15:
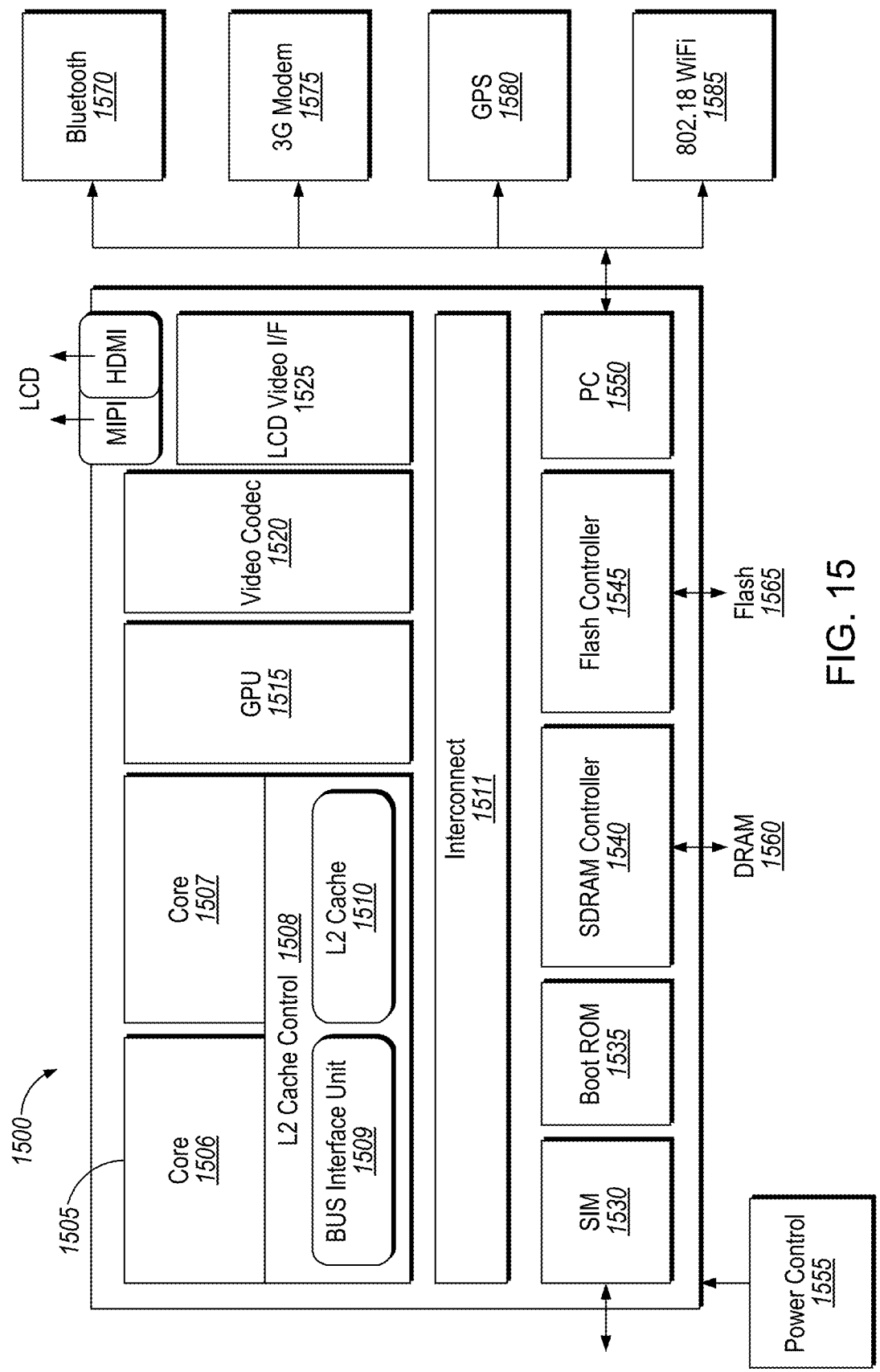
FIG. 15 is a block diagram illustrating a SoC design according to an embodiment of the disclosure.

FIG. 15 is a block diagram of an embodiment of a system on-chip (SoC) design in accordance with the present disclosure. As a specific illustrative example, SoC 1500 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1500 includes 2 cores—1506 and 1507. Cores 1506 and 1507 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1506 and 1507 are coupled to cache control 1508 that is associated with bus interface unit 1509 and L2 cache 1510 to communicate with other parts of system 1500. Interconnect 1511 includes an on-chip interconnect, such as an IOSF, AMBA, or other interconnect discussed above, which potentially implements one or more aspects of the described disclosure. In one embodiment, cores 1506, 1507 may implement hybrid cores as described in embodiments herein.

Interconnect 1511 provides communication channels to the other components, such as a Subscriber Identity Module (SIM) 1530 to interface with a SIM card, a boot ROM 1535 to hold boot code for execution by cores 1506 and 1507 to initialize and boot SoC 1500, a SDRAM controller 1540 to interface with external memory (e.g. DRAM 1560), a flash controller 1545 to interface with non-volatile memory (e.g. Flash 1565), a peripheral control 1550 (e.g. Serial Peripheral Interface) to interface with peripherals, video codecs 1520 and Video interface 1525 to display and receive input (e.g. touch enabled input), GPU 1515 to perform graphics related computations, etc. Any of these interfaces may incorporate aspects of the disclosure described herein. In addition, the system 1500 illustrates peripherals for communication, such as a Bluetooth module 1570, 3G modem 1575, GPS 1580, and Wi-Fi 1585.

Figure 16:
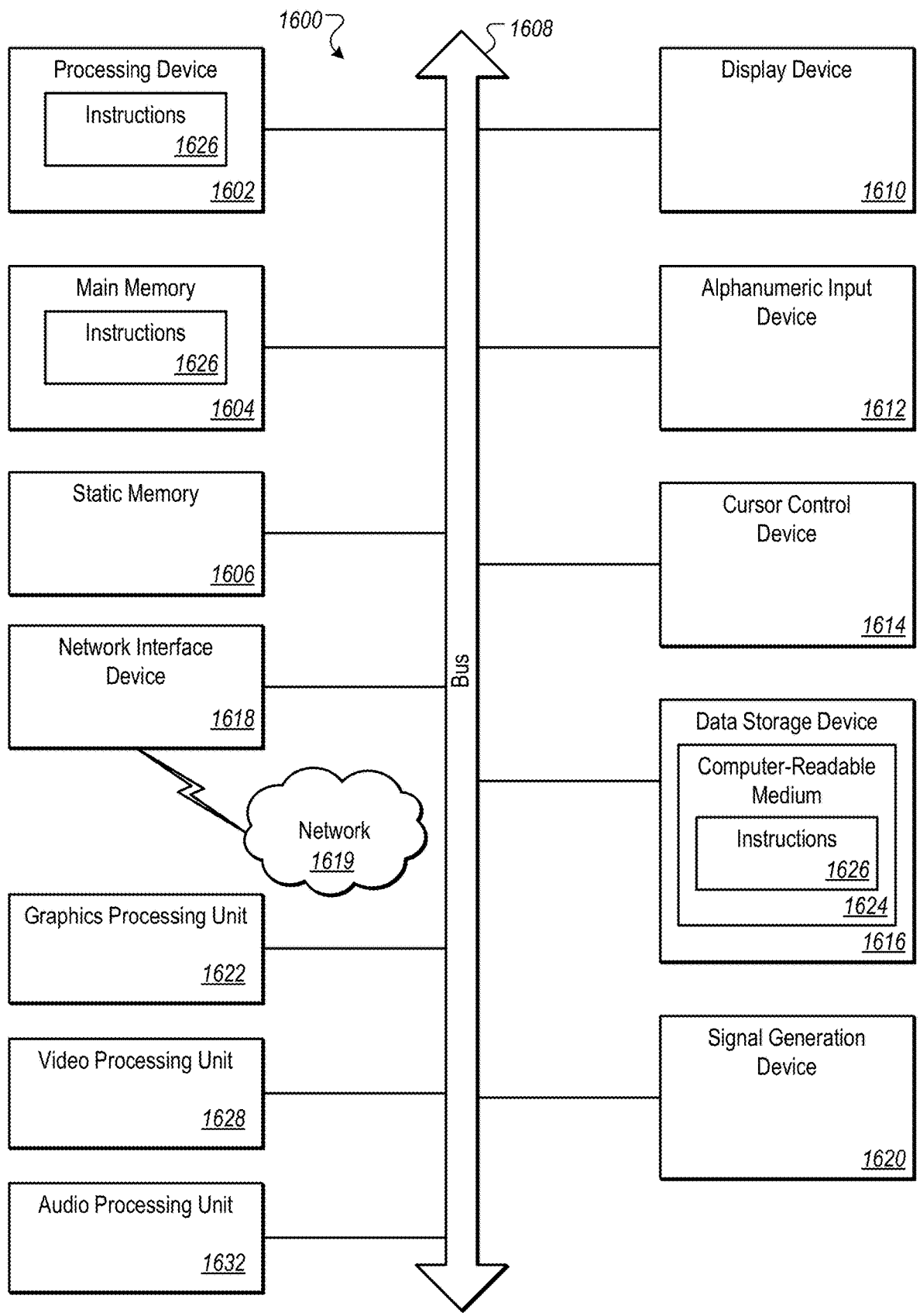
FIG. 16 illustrates a block diagram illustrating a computer system according to an embodiment of the disclosure.

FIG. 16 illustrates a diagrammatic representation of a machine in the example form of a computer system 1600 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 1600 includes a processing device 1602, a main memory 1604 (e.g., read-only memory (ROM), flash memory, dynamic random access memory (DRAM) (such as synchronous DRAM (SDRAM) or DRAM (RDRAM), etc.), a static memory 1606 (e.g., flash memory, static random access memory (SRAM), etc.), and a data storage device 1618, which communicate with each other via a bus 1630.

Processing device 1602 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1602 may also be one or more special-purpose processing devices such as an application specific integrated circuit (ASIC), a field programmable gate array (FPGA), a digital signal processor (DSP), network processor, or the like. In one embodiment, processing device 1602 may include one or more processing cores. The processing device 1602 is configured to execute the processing logic 1626 for performing the operations and steps discussed herein. For example, processing logic 1626 may perform operations as described in FIGS. 4 and 8.

The computer system 1600 may further include a network interface device 1608 communicably coupled to a network 1620. The computer system 1600 also may include a video display unit 1610 (e.g., a liquid crystal display (LCD) or a cathode ray tube (CRT)), an alphanumeric input device 1612 (e.g., a keyboard), a cursor control device 1614 (e.g., a mouse), and a signal generation device 1616 (e.g., a speaker). Furthermore, computer system 1600 may include a graphics processing unit 1622, a video processing unit 1628, and an audio processing unit 1632.

The data storage device 1618 may include a machine-accessible storage medium 1624 on which is stored software 1626 implementing any one or more of the methodologies of functions described herein, such as implementing store address prediction for memory disambiguation as described above. The software 1626 may also reside, completely or at least partially, within the main memory 1604 as instructions 1626 and/or within the processing device 1602 as processing logic 1626 during execution thereof by the computer system 1600; the main memory 1604 and the processing device 1602 also constituting machine-accessible storage media.

The machine-readable storage medium 1624 may also be used to store instructions 1626 implementing store address prediction for hybrid cores such as described according to embodiments of the disclosure. While the machine-accessible storage medium 1624 is shown in an example embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instruction for execution by the machine and that cause the machine to perform any one or more of the methodologies of the present disclosure. The term "machine-accessible storage medium" shall accordingly be taken to include, but not be limited to, solid-state memories, and optical and magnetic media.

The following examples pertain to further embodiments.

Example 1 is a processing device comprising: 1) an input terminal to receive an input stream of source data; 2) an output terminal to output a compressed stream of the source data; and 3) compression circuitry coupled to the input terminal and to the output terminal, wherein the compression circuitry is to encode the input stream with an encoding that translates multiple symbols of fixed length into multiple codes of variable length between one and a maximum length, and wherein to encode, the compression circuitry is to: a) determine at least a first symbol of the multiple symbols that has a first code that exceeds the maximum length; b) identify a short code of the multiple codes that is to be lengthened to provide an increased encoding capacity for the at least the first symbol, the short code having a length less than the maximum length; c) generate multiple code-length converted values comprising to: i) increase the length of the short code to the maximum length; and ii) decrease, to the maximum length, a length of the first code of the at least the first symbol; and d) generate, with use of the multiple code-length converted values, the compressed stream at the output terminal.

In Example 2, the processing device of Example 1, wherein lengths of the multiple codes depend on a depth within an encoding tree of respective symbols of the multiple symbols and wherein the encoding comprises a form of Huffman coding.

In Example 3, the processing device of Example 2, wherein to increase the length of the short code to the maximum length, the compression circuitry is to increase a depth of a second symbol within the encoding tree to a maximum depth, the second symbol being associated with the short code.

In Example 4, the processing device of Example 2, wherein to decrease, to the maximum length, the length of the first code, the compression circuitry is to change a depth, within the encoding tree, of the at least the first symbol to a maximum depth associated with the maximum length.

In Example 5, the processing device of Example 1, wherein the at least the first symbol comprises a first set of symbols, the first code comprises a first set of codes that exceed the maximum length, and wherein to: a) identify the short code, the compression circuitry is to identify the short code of the multiple codes that results in the increased encoding capacity for at least the first set of symbols; and b) decrease the length of the first code, the compression circuitry is to decrease lengths of the first set of codes to the maximum length.

In Example 6, the processing device of Example 5, wherein the compression circuitry is further to: a) increment a first hardware counter for each symbol of the multiple symbols that is processed, to generate a first value; b) determine a minimum code length from a logarithm of the first value; c) increment a second hardware counter to a second value that is equal to a number of the first set of symbols; d) determine a maximum code length from a logarithm of the second value; and e) in response to a determination that the minimum code length is greater than the maximum code length, generate the multiple code-length converted values.

In Example 7, the processing device of Example 6, wherein, in response to a determination that the minimum code length is less than the maximum code length, reduce a frequency range of the multiple symbols to reduce weights of the multiple symbols before tree generation.

In Example 8, the processing device of Example 6, wherein the compression circuitry is further to tag the symbols of the multiple symbols that are greater than the maximum length, and wherein to increment the second hardware counter, the compression circuitry is further to detect the tag of each symbol as respective symbols are processed.

In Example 9, the processing device of Example 1, wherein the compression circuitry is further to: a) determine that at least a first value of multiple code-length converted values is associated with a symbol assigned to a single child node off of a parent node in an encoding sub-tree, wherein a second value of the parent node is smaller than the first value; b) eliminate the child node; and c) assign the symbol to the parent node, which thus assumes the second value of the multiple code-length converted values.

Various implementations may have different combinations of the structural features described above. For instance, all optional features of the processors and methods described above may also be implemented with respect to a system described herein and specifics in the examples may be used anywhere in one or more implementations.

Example 10 is a system comprising: 1) a memory; 2) an input terminal coupled to the memory, the input terminal to receive an input stream of source data from the memory; 3) an output terminal to output a compressed stream of the source data; and 4) compression circuitry coupled to the input terminal and to the output terminal, wherein the compression circuitry is to encode the input stream with an encoding that translates multiple symbols of fixed length into multiple codes of variable length between one and a maximum length, and wherein to encode, the compression circuitry is to: a) determine at least a first symbol of the multiple symbols that has a first code that exceeds the maximum length; b) identify a short code of the multiple codes that is to be lengthened to provide increased encoding capacity for the at least the first symbol, the short code having a length less than the maximum length; c) generate multiple code-length converted values comprising to: i) increase the length of the short code to the maximum length; and ii) decrease, to the maximum length, a length of the first code of the at least the first symbol; and d) generate, with use of the multiple code-length converted values, the compressed stream at the output terminal.

In Example 11, the system of Example 10, wherein lengths of the multiple codes depend on a depth within an encoding tree of respective symbols of the multiple symbols and wherein to decrease, to the maximum length, the length of the first code, the compression circuitry is to change a depth, within the encoding tree, of the at least the first symbol to a maximum depth associated with the maximum length.

In Example 12, the system of Example 10, wherein the at least the first symbol comprises a first set of symbols, the first code comprises a first set of codes that exceed the maximum length, and wherein to: a) identify the short code, the compression circuitry is to identify the short code of the multiple codes that results in the increased encoding capacity for at least the first set of symbols; and b) decrease the length of the first code, the compression circuitry is to decrease lengths of the first set of codes to the maximum length.

In Example 13, the system of Example 12, wherein the maximum length comprises 15 bits, and wherein the compression circuitry is further to: a) determine that the increased encoding capacity comprises a subset of 15-bit codes that are numbered more than the first set of symbols; and b) decrease, back to an original code length, the subset of 15-bits codes to encode as many of the multiple symbols with a fewest possible number of bits.

In Example 14, the system of Example 12, wherein the compression circuitry is further to: a) increment a first hardware counter for each symbol of the multiple symbols that is processed, to generate a first value; b) determine a minimum code length from a logarithm of the first value; c) increment a second hardware counter to a second value that is equal to a number of the first set of symbols; d) determine a maximum code length from a logarithm of the second value; and e) in response to a determination that the minimum code length is greater than the maximum code length, generate the multiple code-length converted values.

Various implementations may have different combinations of the structural features described above. For instance, all optional features of the processors and methods described above may also be implemented with respect to a system described herein and specifics in the examples may be used anywhere in one or more implementations.

In Example 15, is a method comprising: 1) performing, by compression circuitry, compression on an input stream of data received on an input terminal, wherein performing compression comprises encoding the input stream with an encoding that translates multiple symbols of fixed length into multiple codes of variable length between one and a maximum length; 2) determining, by the compression circuitry, at least a first symbol of the multiple symbols that has a first code that exceeds the maximum length; 3) identifying, by the compression circuitry, a short code of the multiple codes that is to be lengthened to provide increased encoding capacity for the at least the first symbol, the short code having a length less than the maximum length; 4) generating, by the compression circuitry, multiple code-length converted values comprising: a) increasing, by the compression circuitry, the length of the short code to the maximum length; and b) decreasing, to the maximum length by the compression circuitry, a length of the first code of the at least the first symbol; and 5) generating, by the compression circuitry with use of the multiple code-length converted values, the compressed stream at an output terminal.

In Example 16, the method of Example 15, wherein lengths of the multiple codes depend on a depth within an encoding tree of respective symbols of the multiple symbols and wherein increasing the length of the short code to the maximum length comprises increasing a depth of a second symbol within the encoding tree to a maximum depth, the second symbol being associated with the short code.

In Example 17, the method of Example 16, wherein decreasing, to the maximum length, the length of the first code, comprises changing a depth, within the encoding tree, of the at least the first symbol to a maximum depth associated with the maximum length.

In Example 18, the method of Example 15, wherein the at least the first symbol comprises a first set of symbols, the first code comprises a first set of codes that exceed the maximum length, and wherein: 1) identifying the short code comprises identifying the short code of the multiple codes that results in the increased encoding capacity for at least the first set of symbols; and 2) decreasing the length of the first code comprises decreasing lengths of the first set of codes to the maximum length.

In Example 19, the method of Example 18, wherein the maximum length comprises 15 bits, the method further comprising: 1) determining that the increased encoding capacity comprises a subset of 15-bit codes that are numbered more than the first set of symbols; and 2) decreasing, back to an original code length, the subset of 15-bits codes to encode as many of the multiple symbols with a fewest possible number of bits.

In Example 20, the method of Example 18, further comprising: 1) incrementing a first hardware counter for each symbol of the multiple symbols that is processed, to generate a first value; 2) determining a minimum code length from a logarithm of the first value; 3) incrementing a second hardware counter to a second value that is equal to a number of the first set of symbols; 4) determining a maximum code length from a logarithm of the second value; and 5) in response to a determination that the minimum code length is greater than the maximum code length, generating the multiple code-length converted values.

In Example 21, the method of Example 20, wherein, in response to determining that the minimum code length is less than the maximum code length, reducing, by executing software, a frequency range of the multiple symbols to reduce weights of the multiple symbols before tree generation.

In Example 22, the method of Example 20, further comprising tagging the symbols of the multiple symbols that are greater than the maximum length, and wherein incrementing the second hardware counter comprises detecting the tag of each symbol as respective symbols are processed.

Various implementations may have different combinations of the structural features described above. For instance, all optional features of the processors and methods described above may also be implemented with respect to a system described herein and specifics in the examples may be used anywhere in one or more implementations.

Example 23 is an apparatus comprising 1) means for performing compression on an input stream of data received on an input terminal, wherein performing compression comprises encoding the input stream with an encoding that translates multiple symbols of fixed length into multiple codes of variable length between one and a maximum length; 2) means for determining at least a first symbol of the multiple symbols that has a first code that exceeds the maximum length; 3) means for identifying a short code of the multiple codes that is to be lengthened to provide increased encoding capacity for the at least the first symbol, the short code having a length less than the maximum length; 4) means for generating multiple code-length converted values comprising: a) means for increasing the length of the short code to the maximum length; and b) means for decreasing, to the maximum length, a length of the first code of the at least the first symbol; and 5) means for generating, with use of the multiple code-length converted values, the compressed stream at an output terminal.

In Example 24, the apparatus of Example 23, wherein lengths of the multiple codes depend on a depth within an encoding tree of respective symbols of the multiple symbols and wherein the means for increasing the length of the short code to the maximum length comprises means for increasing a depth of a second symbol within the encoding tree to a maximum depth, the second symbol being associated with the short code.

In Example 25, the apparatus of Example 24, wherein the means for decreasing, to the maximum length, the length of the first code, comprises means for changing a depth, within the encoding tree, of the at least the first symbol to a maximum depth associated with the maximum length.

In Example 26, the apparatus of Example 23, wherein the at least the first symbol comprises a first set of symbols, the first code comprises a first set of codes that exceed the maximum length, and wherein: 1) the means for identifying the short code comprises means for identifying the short code of the multiple codes that results in the increased encoding capacity for at least the first set of symbols; and 2) the means for decreasing the length of the first code comprises means for decreasing lengths of the first set of codes to the maximum length.

In Example 27, the apparatus of Example 26, wherein the maximum length comprises 15 bits, the method further comprising: 1) means for determining that the increased encoding capacity comprises a subset of 15-bit codes that are numbered more than the first set of symbols; and 2) means for decreasing, back to an original code length, the subset of 15-bits codes to encode as many of the multiple symbols with a fewest possible number of bits.

In Example 28, the apparatus of Example 26, further comprising: 1) means for incrementing a first hardware counter for each symbol of the multiple symbols that is processed, to generate a first value; 2) means for determining a minimum code length from a logarithm of the first value; 3) means for incrementing a second hardware counter to a second value that is equal to a number of the first set of symbols; 4) means for determining a maximum code length from a logarithm of the second value; and 5) in response to a determination that the minimum code length is greater than the maximum code length, means for generating the multiple code-length converted values.

In Example 29, the apparatus of Example 28, wherein, in response to determining that the minimum code length is less than the maximum code length, means for reducing, by executing software, a frequency range of the multiple symbols to reduce weights of the multiple symbols before tree generation.

In Example 30, the apparatus of Example 28, further comprising means for tagging the symbols of the multiple symbols that are greater than the maximum length, and wherein means for incrementing the second hardware counter comprises means for detecting the tag of each symbol as respective symbols are processed.

Various implementations may have different combinations of the structural features described above. For instance, all optional features of the processors and methods described above may also be implemented with respect to a system described herein and specifics in the examples may be used anywhere in one or more implementations.

Example 31 is a non-transitory computer-readable storage medium storing instructions that, when executed by a processing device, cause the instructions to perform a plurality of operations comprising: 1) performing compression on an input stream of data received on an input terminal, wherein performing compression comprises encoding the input stream with an encoding that translates multiple symbols of fixed length into multiple codes of variable length between one and a maximum length; 2) determining at least a first symbol of the multiple symbols that has a first code that exceeds the maximum length; 3) identifying a short code of the multiple codes that is to be lengthened to provide increased encoding capacity for the at least the first symbol, the short code having a length less than the maximum length; 4) generating multiple code-length converted values comprising: a) increasing the length of the short code to the maximum length; and b) decreasing a length of the first code of the at least the first symbol; and 5) generating, with use of the multiple code-length converted values, the compressed stream at an output terminal.

In Example 32, the non-transitory computer-readable storage medium of Example 31, wherein lengths of the multiple codes depend on a depth within an encoding tree of respective symbols of the multiple symbols and wherein increasing the length of the short code to the maximum length comprises increasing a depth of a second symbol within the encoding tree to a maximum depth, the second symbol being associated with the short code.

In Example 33, the non-transitory computer-readable storage medium of Example 32, wherein decreasing, to the maximum length, the length of the first code, comprises changing a depth, within the encoding tree, of the at least the first symbol to a maximum depth associated with the maximum length.

In Example 34, the non-transitory computer-readable storage medium of Example 31, wherein the at least the first symbol comprises a first set of symbols, the first code comprises a first set of codes that exceed the maximum length, and wherein: 1) identifying the short code comprises identifying the short code of the multiple codes that results in the increased encoding capacity for at least the first set of symbols; and 2) decreasing the length of the first code comprises decreasing lengths of the first set of codes to the maximum length.

In Example 35, the non-transitory computer-readable storage medium of Example 34, wherein the maximum length comprises 15 bits, the plurality of operations further comprising: 1) determining that the increased encoding capacity comprises a subset of 15-bit codes that are numbered more than the first set of symbols; and 2) decreasing, back to an original code length, the subset of 15-bits codes to encode as many of the multiple symbols with a fewest possible number of bits.

In Example 36, the non-transitory computer-readable storage medium of Example 34, wherein the plurality of operations further comprises: 1) incrementing a first hardware counter for each symbol of the multiple symbols that is processed, to generate a first value; 2) determining a minimum code length from a logarithm of the first value; 3) incrementing a second hardware counter to a second value that is equal to a number of the first set of symbols; 4) determining a maximum code length from a logarithm of the second value; and 5) in response to a determination that the minimum code length is greater than the maximum code length, generating the multiple code-length converted values.

In Example 37, the non-transitory computer-readable storage medium of Example 36, wherein, in response to determining that the minimum code length is less than the maximum code length, reducing, by executing software, a frequency range of the multiple symbols to reduce weights of the multiple symbols before tree generation.

In Example 38, the non-transitory computer-readable storage medium of Example 36, wherein the plurality of operations further comprises tagging the symbols of the multiple symbols that are greater than the maximum length, and wherein incrementing the second hardware counter comprises detecting the tag of each symbol as respective symbols are processed.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and/or 'operable to,' in one embodiment, refers to some apparatus, logic, hardware, and/or element designed in such a way to enable use of the apparatus, logic, hardware, and/or element in a specified manner. Note as above that use of 'to,' 'capable of/to,' and/or 'operable to,' in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 910 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

The invention claimed is:

1. A processing device comprising:
   an input terminal to receive an input stream of source data;
   an output terminal to output a compressed stream of the source data; and
   compression circuitry coupled to the input terminal and to the output terminal, wherein the compression circuitry is to encode the input stream with an encoding that translates multiple symbols of fixed length into multiple codes of variable length between one and a maximum length, and wherein to encode the compressed stream, the compression circuitry is further to:
   determine at least a first symbol of the multiple symbols that has a first code that exceeds the maximum length;
   identify a short code of the multiple codes that is to be lengthened to provide an increased encoding capacity for the at least the first symbol, the short code having a length less than the maximum length;
   generate multiple code-length converted values comprising to:
   increase the length of the short code to the maximum length; and
   decrease, to the maximum length, a length of the first code of the at least the first symbol; and
   generate, with use of the multiple code-length converted values, the compressed stream at the output terminal.

2. The processing device of claim 1, wherein lengths of the multiple codes depend on a depth within an encoding tree of respective symbols of the multiple symbols and wherein the encoding comprises a form of Huffman coding.

3. The processing device of claim 2, wherein to increase the length of the short code to the maximum length, the compression circuitry is to increase a depth of a second symbol within the encoding tree to a maximum depth, the second symbol being associated with the short code.

4. The processing device of claim 2, wherein to decrease, to the maximum length, the length of the first code, the compression circuitry is to change a depth, within the encoding tree, of the at least the first symbol to a maximum depth associated with the maximum length.

5. The processing device of claim 1, wherein the at least the first symbol comprises a first set of symbols, the first code comprises a first set of codes that exceed the maximum length, and wherein to:
   identify the short code, the compression circuitry is to identify the short code of the multiple codes that results in the increased encoding capacity for at least the first set of symbols; and
   decrease the length of the first code, the compression circuitry is to decrease lengths of the first set of codes to the maximum length.

6. The processing device of claim 1, wherein the at least the first symbol comprises a first set of symbols, wherein the compression circuitry is further to:
   increment a first hardware counter for each symbol of the multiple symbols that is processed, to generate a first value;
   determine a minimum code length from a logarithm of the first value;
   increment a second hardware counter to a second value that is equal to a number of the first set of symbols;
   determine a maximum code length from a logarithm of the second value; and
   in response to a determination that the minimum code length is greater than the maximum code length, generate the multiple code-length converted values.

7. The processing device of claim 6, wherein, in response to a determination that the minimum code length is less than the maximum code length, reduce a frequency range of the multiple symbols to reduce weights of the multiple symbols before tree generation.

8. The processing device of claim 6, wherein the compression circuitry is further to tag symbols of the multiple symbols that are greater than the maximum length, and wherein to increment the second hardware counter, the compression circuitry is further to detect a tag of each symbol as respective symbols of the multiple symbols are processed.

9. The processing device of claim 1, wherein the compression circuitry is further to:
   determine that at least a first value of multiple code-length converted values is associated with a symbol assigned to a single child node off of a parent node in an encoding sub-tree, wherein a second value of the parent node is smaller than the first value;
   eliminate the single child node; and
   assign the symbol to the parent node, which thus assumes the second value of the multiple code-length converted values.

10. A system comprising:
   a memory;
   an input terminal coupled to the memory, the input terminal to receive an input stream of source data from the memory;
   an output terminal to output a compressed stream of the source data; and
   compression circuitry coupled to the input terminal and to the output terminal, wherein the compression circuitry is to encode the input stream with an encoding that translates multiple symbols of fixed length into multiple codes of variable length between one and a maximum length, and wherein to encode the compressed stream, the compression circuitry is further to:
      determine at least a first symbol of the multiple symbols that has a first code that exceeds the maximum length;
      identify a short code of the multiple codes that is to be lengthened to provide increased encoding capacity for the at least the first symbol, the short code having a length less than the maximum length;
      generate multiple code-length converted values comprising:
         increase the length of the short code to the maximum length; and
         decrease, to the maximum length, a length of the first code of the at least the first symbol; and
      generate, with use of the multiple code-length converted values, the compressed stream at the output terminal.

11. The system of claim 10, wherein lengths of the multiple codes depend on a depth within an encoding tree of respective symbols of the multiple symbols and wherein to decrease, to the maximum length, the length of the first code, the compression circuitry is to change a depth, within the encoding tree, of the at least the first symbol to a maximum depth associated with the maximum length.

12. The system of claim 10, wherein the at least the first symbol comprises a first set of symbols, the first code comprises a first set of codes that exceed the maximum length, and wherein to:
   identify the short code, the compression circuitry is to identify the short code of the multiple codes that results in the increased encoding capacity for at least the first set of symbols; and
   decrease the length of the first code, the compression circuitry is to decrease lengths of the first set of codes to the maximum length.

13. The system of claim 12, wherein the maximum length comprises 15 bits, and wherein the compression circuitry is further to:
   determine that the increased encoding capacity comprises a subset of 15-bit codes that are numbered more than the first set of symbols; and
   decrease, back to an original code length, the subset of 15-bit codes to encode as many of the multiple symbols with a fewest possible number of bits.

14. The system of claim 10, wherein the at least the first symbol comprises a first set of symbols, wherein the compression circuitry is further to:
   increment a first hardware counter for each symbol of the multiple symbols that is processed, to generate a first value;
   determine a minimum code length from a logarithm of the first value;
   increment a second hardware counter to a second value that is equal to a number of the first set of symbols;
   determine a maximum code length from a logarithm of the second value; and
   in response to a determination that the minimum code length is greater than the maximum code length, generate the multiple code-length converted values.

15. A method comprising:
   performing, by compression circuitry, compression on an input stream of data received on an input terminal, wherein performing compression comprises encoding the input stream with an encoding that translates multiple symbols of fixed length into multiple codes of variable length between one and a maximum length;
   determining, by the compression circuitry, at least a first symbol of the multiple symbols that has a first code that exceeds the maximum length;
   identifying, by the compression circuitry, a short code of the multiple codes that is to be lengthened to provide increased encoding capacity for the at least the first symbol, the short code having a length less than the maximum length;
   generating, by the compression circuitry, multiple code-length converted values comprising:
      increasing, by the compression circuitry, the length of the short code to the maximum length; and
      decreasing, to the maximum length by the compression circuitry, a length of the first code of the at least the first symbol; and
   generating, by the compression circuitry with use of the multiple code-length converted values, a compressed stream at an output terminal.

16. The method of claim 15, wherein lengths of the multiple codes depend on a depth within an encoding tree of respective symbols of the multiple symbols and wherein increasing the length of the short code to the maximum length comprises increasing a depth of a second symbol within the encoding tree to a maximum depth, the second symbol being associated with the short code.

17. The method of claim 16, wherein decreasing, to the maximum length, the length of the first code, comprises changing a depth, within the encoding tree, of the at least the first symbol to a maximum depth associated with the maximum length.

18. The method of claim 15, wherein the at least the first symbol comprises a first set of symbols, the first code comprises a first set of codes that exceed the maximum length, and wherein:

identifying the short code comprises identifying the short code of the multiple codes that results in the increased encoding capacity for at least the first set of symbols; and decreasing the length of the first code comprises decreasing lengths of the first set of codes to the maximum length.

19. The method of claim 18, wherein the maximum length comprises 15 bits, the method further comprising:

determining that the increased encoding capacity comprises a subset of 15-bit codes that are numbered more than the first set of symbols; and decreasing, back to an original code length, the subset of 15-bit codes to encode as many of the multiple symbols with a fewest possible number of bits.

20. The method of claim 15, wherein the at least the first symbol comprises a first set of symbols, further comprising:

incrementing a first hardware counter for each symbol of the multiple symbols that is processed, to generate a first value;

determining a minimum code length from a logarithm of the first value;

incrementing a second hardware counter to a second value that is equal to a number of the first set of symbols;

determining a maximum code length from a logarithm of the second value; and in response to a determination that the minimum code length is greater than the maximum code length, generating the multiple code-length converted values.

21. The method of claim 20, wherein, in response to determining that the minimum code length is less than the maximum code length, reducing, by executing software, a frequency range of the multiple symbols to reduce weights of the multiple symbols before tree generation.

22. The method of claim 20, further comprising tagging symbols of the multiple symbols that are greater than the maximum length, and wherein incrementing the second hardware counter comprises detecting a tag of each symbol as respective symbols are processed.

* * * * *